(12) United States Patent
Shiraishi et al.

(10) Patent No.: US 10,836,630 B2
(45) Date of Patent: Nov. 17, 2020

(54) MEMS PACKAGE AND METHOD OF MANUFACTURING THE SAME

(71) Applicant: SAE Magnetics (H.K.) Ltd., Hong Kong (HK)

(72) Inventors: Masashi Shiraishi, Hong Kong (HK); Toyotaka Kobayashi, Hong Kong (HK); Hironobu Hayashi, Hong Kong (HK); Ichiro Yagi, Hong Kong (HK); Bing Ma, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 0 days.

(21) Appl. No.: 16/273,145

(22) Filed: Feb. 11, 2019

(65) Prior Publication Data
US 2020/0087139 A1    Mar. 19, 2020

(30) Foreign Application Priority Data

Sep. 17, 2018 (CN) .......................... 2018 1 1079640

(51) Int. Cl.
*H01L 23/02* (2006.01)
*B81B 7/00* (2006.01)
*B81B 7/02* (2006.01)
*B81C 1/00* (2006.01)

(52) U.S. Cl.
CPC .............. *B81B 7/0032* (2013.01); *B81B 7/02* (2013.01); *B81C 1/00269* (2013.01); *B81B 2201/0257* (2013.01); *B81B 2203/0127* (2013.01); *B81B 2207/09* (2013.01); *B81C 2203/0118* (2013.01)

(58) Field of Classification Search
CPC . B81B 7/02; B81B 7/0032; B81B 2201/0257; B81B 2203/0127
USPC .......................................................... 257/778
See application file for complete search history.

(56) References Cited

U.S. PATENT DOCUMENTS

| | | | | |
|---|---|---|---|---|
| 9,078,063 | B2 * | 7/2015 | Loeppert | H04R 1/08 |
| 9,565,488 | B2 | 2/2017 | Friza et al. | |
| 2006/0157841 | A1 * | 7/2006 | Minervini | H04R 19/04 |
| | | | | 257/680 |
| 2006/0177085 | A1 * | 8/2006 | Izuchi | H04R 1/086 |
| | | | | 381/369 |
| 2008/0247585 | A1 * | 10/2008 | Leidl | B81B 7/0061 |
| | | | | 381/360 |
| 2010/0264499 | A1 * | 10/2010 | Goodelle | H04R 1/04 |
| | | | | 257/416 |
| 2012/0237073 | A1 * | 9/2012 | Goida | H04R 1/02 |
| | | | | 381/361 |

FOREIGN PATENT DOCUMENTS

| | | |
|---|---|---|
| JP | 2007184341 A | 7/2007 |
| JP | 3974574 B2 | 9/2007 |
| JP | 201239272 A | 2/2012 |
| JP | 2012114672 A | 6/2012 |
| JP | 2016523725 A | 8/2016 |

* cited by examiner

*Primary Examiner* — Nitin Parekh

(57) ABSTRACT

A MEMS package has a MEMS chip, and a package substrate which the MEMS chip is adhered. The MEMS chip has an element substrate which a movable element is formed. The MEMS package has a particle filter formed on the package substrate or the MEMS chip. The particle filter has a pierced-structure, which plural through holes are formed on a base surface by a regular arrangement. Further, in the particle filter, a plane-opening rate is set at least 45%, and a thickness-opening rate is set at least 50%.

9 Claims, 32 Drawing Sheets

MEMS PACKAGE AND METHOD OF MANUFACTURING THE SAME

CROSS REFERENCE TO RELATED APPLICATIONS

The present application claims the benefit of Chinese Patent Application No. 201811079640.0 filed on Sep. 17, 2018, the contents of which are incorporated herein by reference in its entirety.

BACKGROUND

Field of the Invention

The present invention relates to a MEMS package which a MEMS chip, being used as a microphone, a sensor and so on, is mounted on a package substrate and method of manufacturing the same.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound pressure, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by a FCB (Flip Chip Bonding, for example see JP2016-523725 (also called patent document 1), JP2007-184341 (also called patent document 2)), and the other one is a structure which the MEMS chip is mounted on the package substrate by a Wire Bonding (for example see JP2012-114672 (also called patent document 3), JP2012-39272 (also called patent document 4).

SUMMARY OF THE INVENTION

In case of the MEMS, which is used as the microphone of capacitance-type, there are conventionally two following problems caused by particles entered from the outside. A) The particles hit the membrane, thereby the membrane was damaged. B) The particles enter into the space between two electrodes, it lowers the function of the variable capacitor. Therefore, a microphone-module, which a thin-film (particle filter) for keeping the particles out is formed on the sound hole, is conventionally known (for example see U.S. Pat. No. 9,565,488 (also called patent document 5). Further, a microphone-unit, which a provided film keeps the dust out in the mounting step or the like, is also known (for example see the patent document 4).

In case of the microphone-module disclosed in the patent document 5, many through holes are formed in the particle filter. Then it is preferable that the size of the through hole is as small as possible for keeping the particles out.

However, when the size of the through hole is small, air is hard to pass through the particle filter. Then, the pressure of sound guided to the MEMS chip is likely to be lowered. Further, when the thickness of the particle filter is large, the particle filter disturbs vibration of air. Thereby, sensitivity of the microphone and mic characteristic such as SNR (Signal-to-Noise Ratio) or the like are greatly lowered.

Therefore, the particle filter conventionally needs to keep the particles out with avoiding the decline of the sensitivity of the microphone and mic characteristic as much as possible. However, the particle filter, of the microphone-module disclosed in the patent document 5, is not able to actualize the above.

Further, in case of the microphone-unit disclosed in the patent document 4, the film, which almost covers the opening part, is provided in the mounting step or the like. However, the film is removed, after the microphone-unit is mounted on the mounting-object. Therefore, the particles are never kept out after mounting.

As described above, the MEMS chip or the MEMS package, which are used as the microphone or the like, need to keep the particles out effectively with avoiding the decline of the sensitivity and mic characteristic as much as possible, even if after the MEMS chip is mounted on the mounting-object such as a package substrate or the like.

Hence the present invention is made to solve the above problem, and it is an object that the particles are effectively kept out with avoiding the decline of the sensitivity and mic characteristic, even if after the MEMS chip is mounted on the mounting-object such as the package substrate or the like, in the MEMS package and method of the manufacturing the same.

To solve the above problem, the present invention is a MEMS package including: a MEMS chip, and a package substrate which the MEMS chip is adhered; the MEMS chip includes an element substrate which a movable element is formed, the MEMS package includes a particle filter formed on the package substrate or the MEMS chip, the particle filter includes a pierced-structure, which plural through holes are formed on a base surface by a regular arrangement, in the particle filter, a plane-opening rate, defined as the ratio of the size of the plural through holes to the size of the base surface, is set at least 45%, and a thickness-opening rate, defined as the ratio of the size of the through hole to the thickness of the particle filter, is set at least 50%.

In case of the above-described MEMS package, it is possible that the plural through holes are formed in a circular-shape in a plan view, the plane-opening rate is set by the ratio of the following X2 to the following X1, X1: the size of the polygon which at least three centers, of the adjacent representative through holes in the plural through holes, are vertexes, X2: the size of the parts, arranged in the polygon, of the representative through holes.

Further, in case of the above-described MEMS package, it is preferable that the plural through holes are formed in a circular-shape in a plan view, the particle filter has a first through hole-group and a second through hole-group, having respectively the plural through holes, the first through hole-group has a first through hole, arranged in a position which the interval to a peripheral end part of the base surface is set a first interval, and the plural through holes are arranged at a constant interval in a straight line, the second through hole-group has a second through hole, arranged in a position which the interval to the peripheral end part is set a second interval different from the first interval, and the plural through holes are arranged at a constant interval in a straight line, in the particle filter, a first line, formed by the first through hole-group, and a second line, formed by the second through hole-group, are arranged alternately.

Further, in case of the above-described MEMS package, it is preferable that the plural through holes are formed in a circular-shape in a plan view, the particle filter has a first through hole-group and a second through hole-group, having respectively the plural through holes, the first through hole-group has a first through hole, arranged in a position which the interval to a peripheral end part of the base surface is set a first interval, and the plural through holes are arranged at a constant interval in a straight line, the second through hole-group has a second through hole, arranged in a position which the interval to the peripheral end part is set a second interval different from the first interval, and the plural through holes are arranged at a constant interval in a straight line, the particle filter is formed so that the center of the through hole, included in the second through hole-group, is arranged between the centers of the adjacent through holes, included in the first through hole-group.

Furthermore, in case of the above-described MEMS package, it is preferable that in the particle filter, the adjacent plural through holes, including both the through hole included in the first through hole-group and the through hole included in the second through hole-group, are arranged so as to form a regular triangle which the centers of the adjacent plural through holes are vertexes.

Further, it is preferable that in the particle filter, the adjacent plural through holes, including both the through hole included in the first through hole-group and the through hole included in the second through hole-group, are arranged so as to form a regular triangle which the centers of the adjacent plural through holes are vertexes, and the area of the through hole is greater than or equal to the 90% area of the regular triangle.

Further, it is preferable that the plural through holes are formed in a circular-shape in a plan view, the particle filter has plural through hole-groups having respectively the plural through holes, the through hole-groups have an end-through hole arranged in a position which the interval between a peripheral end part of the base surface and the end-through hole is set a constant end-interval, and the plural through holes are arranged at a constant interval in a straight line, in the particle filter, the adjacent four through holes, included respectively in the adjacent two through hole-groups in the plural through hole groups, are arranged so as to form a square which the four centers of the adjacent four through hole are vertexes, and the area of the through hole is greater than or equal to 45% of the area of the square.

Further, the present invention provides a method of manufacturing a MEMS package, using a MEMS chip and a package substrate which the MEMS chip is adhered including: a photosensitive-adhesive layer forming step of forming a photosensitive-adhesive layer, made of photosensitive-adhesive, on a surface of a package-panel which plural package-regions for manufacturing the package substrate are formed; a filter-wafer manufacturing step for manufacturing a filter-wafer by performing a thermal-removal layer forming step, for forming a thermal-removal layer being removed by heating on a semiconductor wafer, and a filter-layer forming step, for forming a filter-layer, which plural filter-regions, for forming particle filters, are formed on the thermal-removal layer by the arrangement in accordance with the respective package-regions; a filter-layer removing step for removing the filter-layer together with the thermal-removal layer, from the semiconductor wafer, by heating the filter-wafer manufactured by the filter-wafer manufacturing step; and a filter-layer transcribing step for transcribing the filter-layer, removed by the filter-layer removing step, on the package-panel.

In case of the above-described method of manufacturing a MEMS package, it is preferable that the method of manufacturing a MEMS package, further including: a hydrophobicity-applying step of applying hydrophobicity to the package-panel, by putting the package-panel, which the filter-layer are transcribed, in a hydrophobic-vessel having gas phase of raw materials used for hydrophobicity-applying, and by using hydrophobic-gas made of the raw materials.

Further, it is preferable that the method of manufacturing a MEMS package, further including: a MEMS chip mounting step for mounting the MEMS chips respectively on the package-regions of the package-panel which the filter-layer are transcribed; and a panel cutting step for cutting a panel-with-chip, which the MEMS chips are mounted by the MEMS chip mounting step, into the respective package-regions.

Furthermore, it is possible that the filter-wafer manufacturing step for forming the filter-layer so that a pierced-structure, which plural through holes are formed on a base surface by a regular arrangement, is formed in the respective filter region, and a plane-opening rate, defined as a ratio of the size of the plural through holes to the size of the base surface, is set at least 45%.

Further, it is possible that the method of manufacturing a MEMS package, further including, a hydrophobicity-applying step of applying hydrophobicity to the panel-with-chip, by putting the panel-with-chip in a hydrophobic-vessel having gas phase of raw materials used for hydrophobicity-applying, and by using hydrophobic-gas made of the raw materials.

Further, the present invention provides a method of manufacturing a MEMS package, using a MEMS chip and a package substrate which the MEMS chip is adhered including: a filter-wafer manufacturing step for manufacturing a filter-wafer by performing a thermal-removal layer forming step, for forming a thermal-removal layer being removed by heating on a semiconductor wafer, and a filter-layer forming step, for forming a filter-layer, which plural filter-regions, for forming particle filters, are formed; a photosensitive-adhesive layer forming step of forming a photosensitive-adhesive layer, made of photosensitive-adhesive, on a surface of the filter-wafer manufactured by the filter-wafer manufacturing step; a substrate piling-up step for manufacturing a piled-up substrate piled up a MEMS-wafer, which plural MEMS regions for forming the MEMS chips are formed, and the filter-wafer, after a alignment between each MEMS region and each filter region is performed; and a filter-layer transcribing step for heating the piled-up substrate to remove the semiconductor wafer together with the thermal-removal layer, and the filter-layer is transcribed on the MEMS-wafer.

Furthermore, it is preferable that the method of manufacturing a MEMS package, further including: a hydrophobicity-applying step of applying hydrophobicity to the MEMS-wafer, by putting the MEMS-wafer, which the filter-layer is transcribed, in a hydrophobic-vessel having gas phase of raw materials used for hydrophobicity-applying, and by using hydrophobic-gas made of the raw materials.

Further, it is preferable that the method of manufacturing a MEMS package, further including: a MEMS chip manufacturing step for manufacturing plural the MEMS chips by cutting the MEMS-wafer, which the filter-layer is transcribed, into the respective MEMS regions; a MEMS chip mounting step for mounting the MEMS chips manufactured by the MEMS chip manufacturing step on the package substrate; and a MEMS chip connecting step for connecting the MEMS chips to the package substrates by a wire-bonding or a flip chip bonding.

Further, it is preferable that filter-wafer manufacturing step for forming the filter-layer so that a pierced-structure, which plural through holes are formed on a base surface by a regular arrangement, is formed in the respective filter region, and a plane-opening rate, defined as a ratio of the size of the plural through holes to the size of the base surface, is set at least 45%.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

First Embodiment

In the following, embodiments of the present invention will be described with reference to the drawings. Note that the same components will be referred to with the same numerals or letters, while omitting their overlapping descriptions.

(Structure of the MEMS package)

Figure 1:
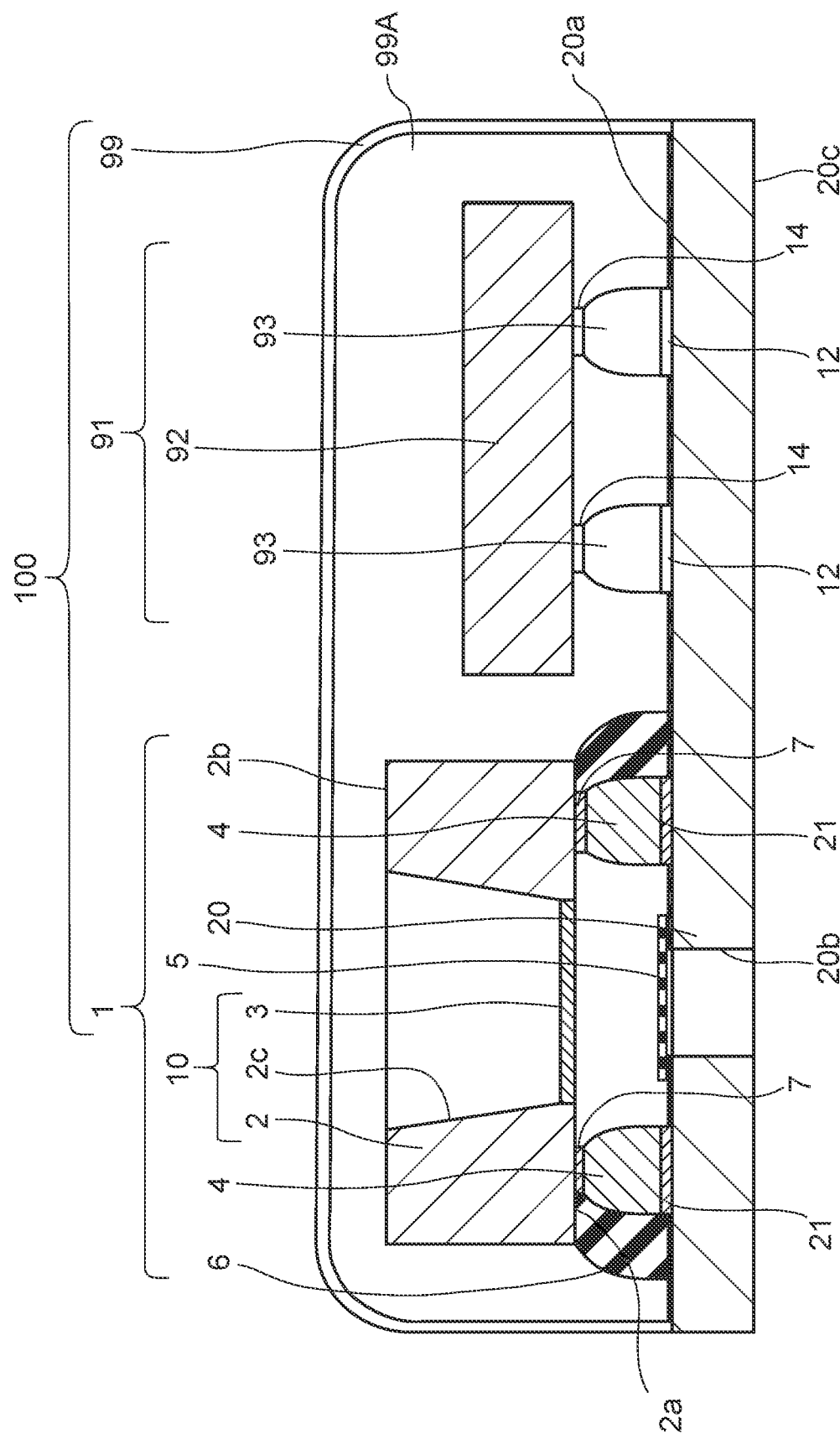
FIG. 1 is a sectional view of a part corresponding to the line 1-1 in FIG. 3 showing a MEMS microphone having the MEMS package according to the first embodiment of the present invention.
Figure 2:
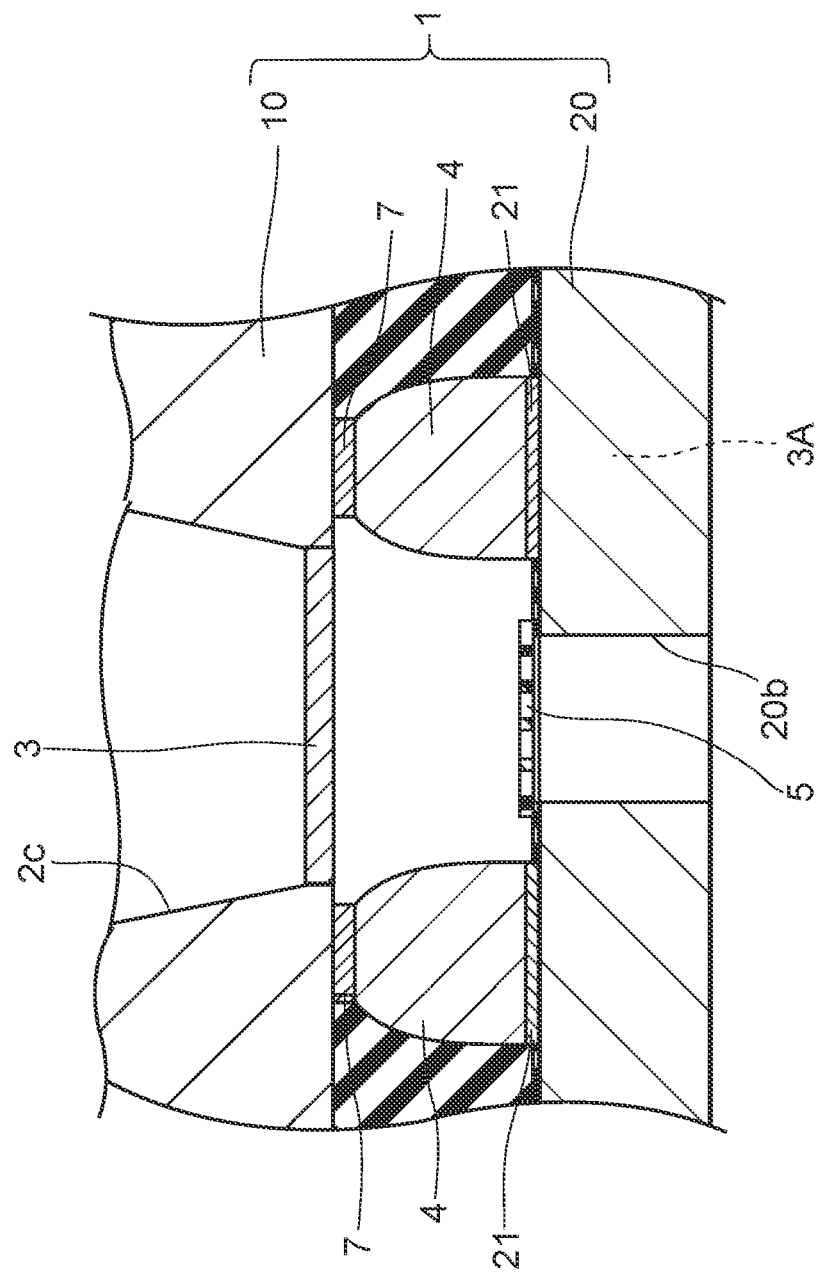
FIG. 2 is a sectional view showing a principal part of FIG. 1 with enlargement.
Figure 3:
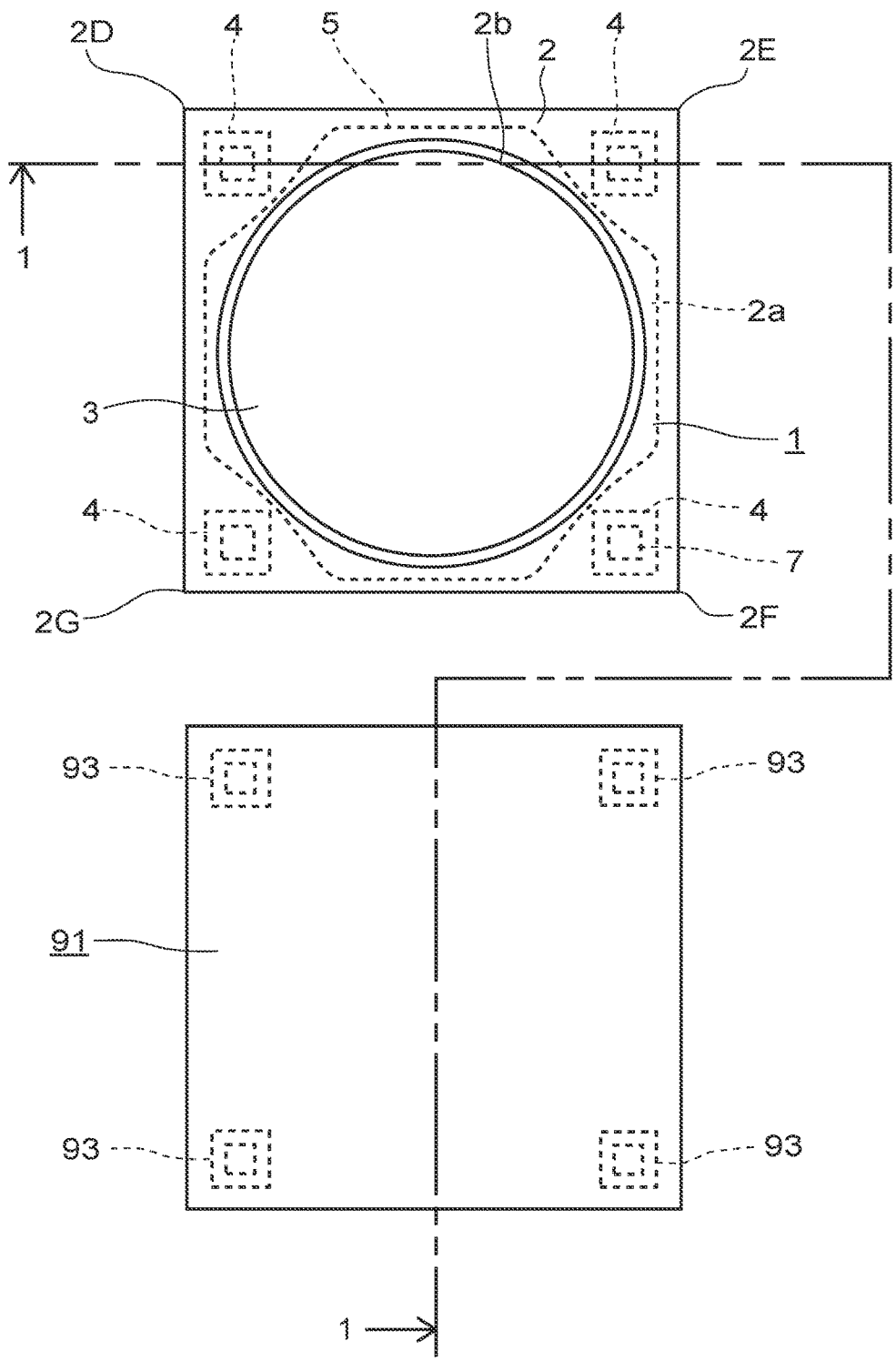
FIG. 3 is a plan view showing a principal part of the MEMS microphone which a cap is removed.
Figure 4:
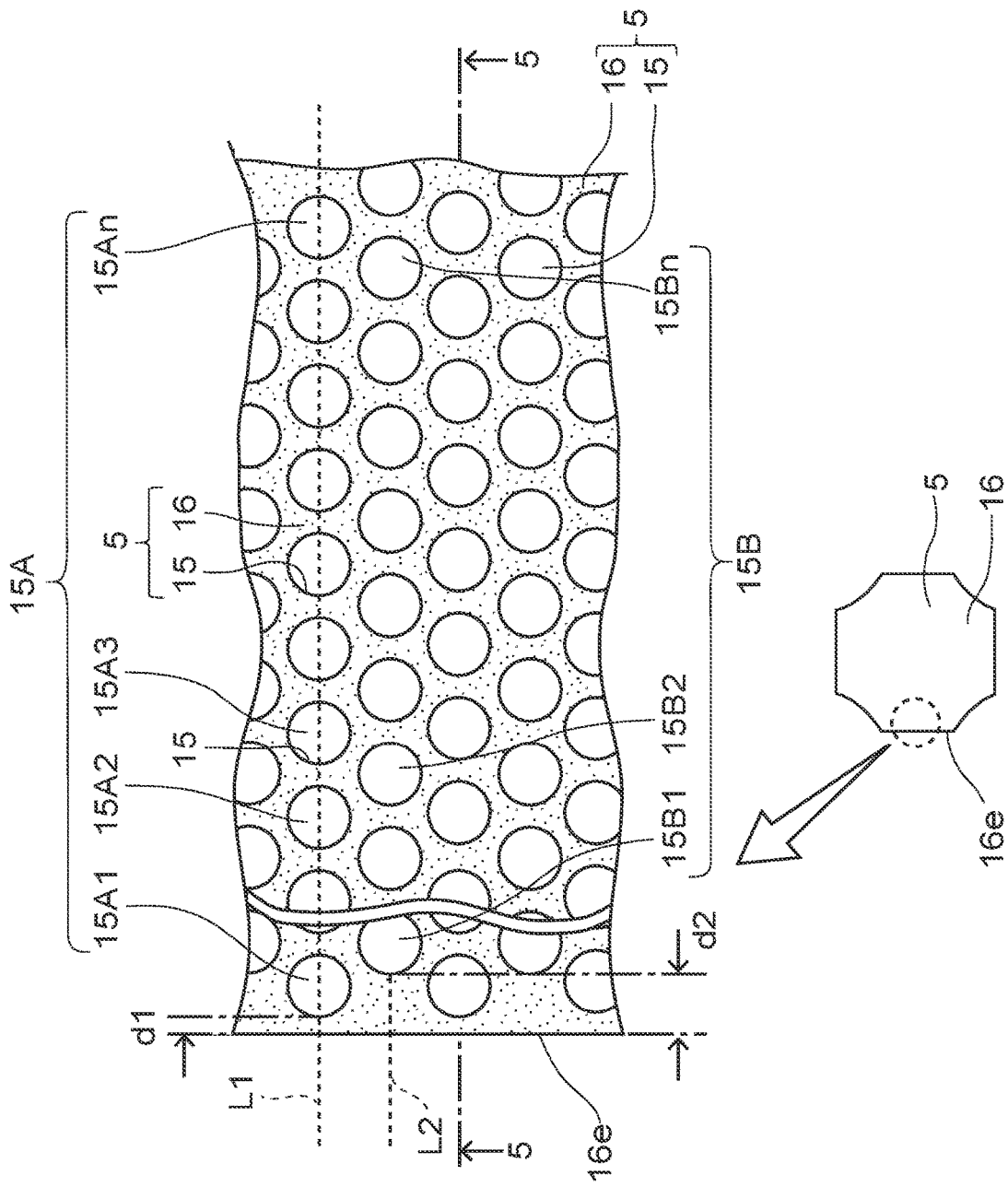
FIG. 4 is a plan view showing a principal part of a particle filter.
Figure 5:
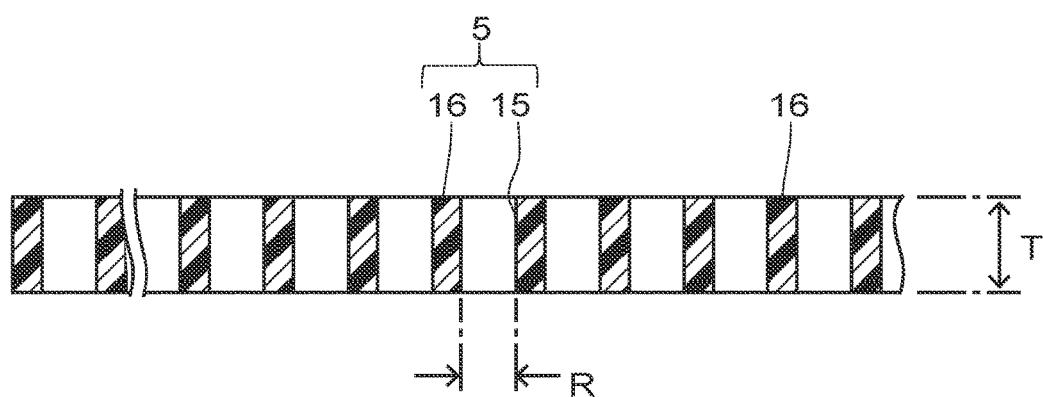
FIG. 5 is a sectional view of a part corresponding to the line 5-5 in FIG. 4.
Figure 6:
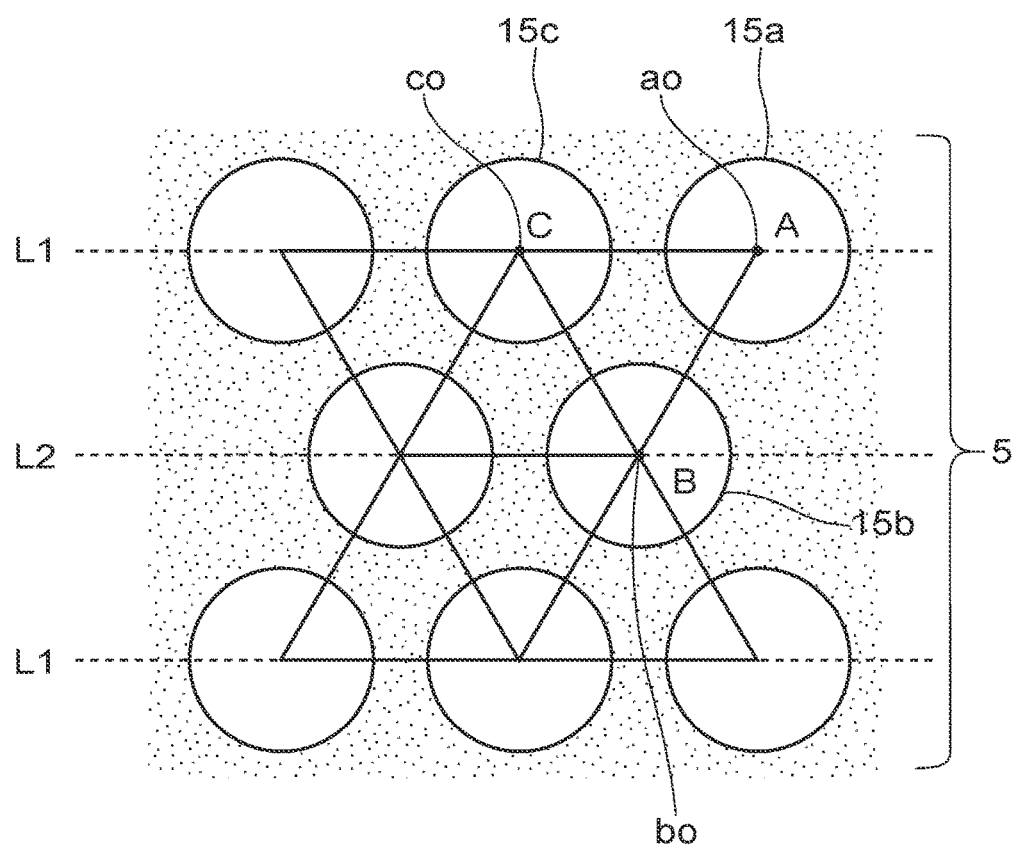
FIG. 6 is a plan view showing a part, including plural through holes including representative through holes, of the particle filter.
Figure 7:
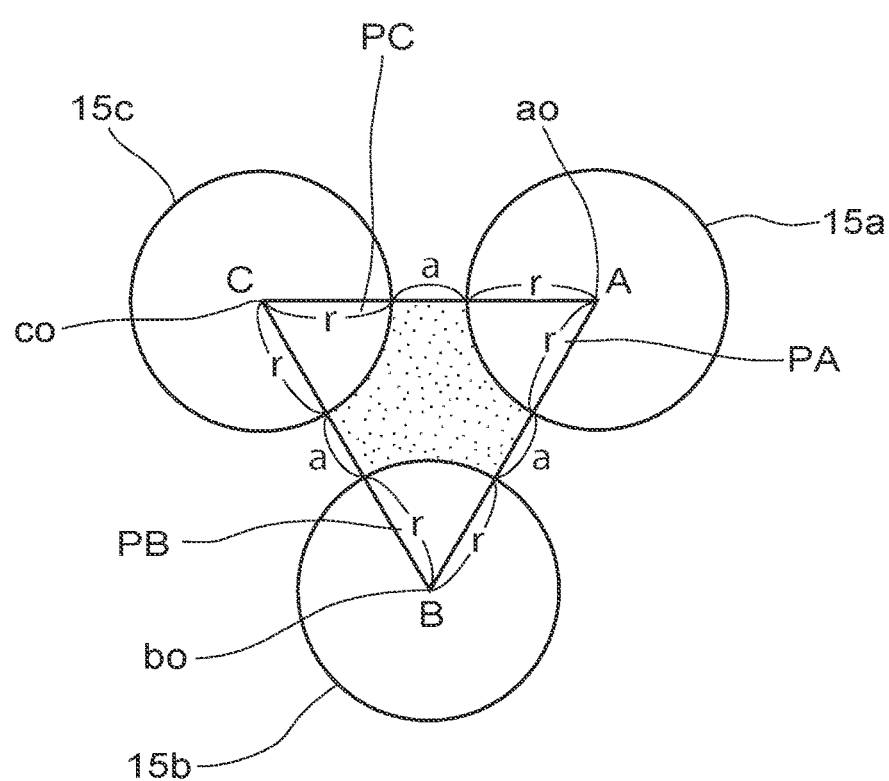
FIG. 7 is a plan view showing a part, including the representative through holes, of the particle filter.

To begin with, the structure of the MEMS package 1 according to the first embodiment of the present invention will be explained with reference to FIG. 1 to FIG. 7. Here, FIG. 1 is a sectional view of a part corresponding to the line 1-1 in FIG. 3 showing the MEMS microphone 100 having the MEMS package 1 according to the first embodiment of the present invention, FIG. 2 is a sectional view showing a principal part of FIG. 1 with enlargement. FIG. 3 is a plan view showing a principal part of the MEMS microphone 100 which a cap 99 is removed. FIG. 4 is a plan view showing a principal part of the particle filter 5, FIG. 5 is a sectional view of a part corresponding to the line 5-5 in FIG. 4. FIG. 6 is a plan view showing a part, including the plural through holes 15 including the representative through holes 15a, 15b, 15c, of the particle filter 5, FIG. 7 is a plan view showing a part, including the representative through holes 15a, 15b, 15c, of the particle filter 5.

As illustrated in FIG. 1, the MEMS microphone 100 has the MEMS package 1, ASIC (Application Specific Integrated Circuit) package 91 and the cap 99.

The MEMS package 1 has the MEMS chip 10, the package substrate 20, which the MEMS package 1 is adhered, four bonding bumps 4, the particle filter 5 and a sound shield 6.

The MEMS chip 10 has an element substrate 2 which the membrane 3, as a movable element, is formed. The MEMS chip 10 is used as the microphone of capacitance-type. The element substrate 2 is a substrate formed in a rectangular-shape in a plan view, as illustrated in FIG. 3, and it is formed with silicon. A hole part 2c is formed in the center of the element substrate 2. The hole part 2c is formed in a cylindrical-shape from an upper surface 2b (outside surface of the element substrate 2) of the element substrate 2 to an opposing surface 2a (the surface opposing to the package substrate 20), and the membrane 3 is formed in the opposing surface 2a side of the hole part 2c. Note that two thin-films, which are called back-plates (not illustrated), are arranged in the upper side and the lower side of the membrane 3.

As illustrated in FIG. 1, the bonding bumps 4 are solder bumps adhered to both the opposing surface 2a and the package substrate 20. The MEMS package 1 has four bonding bumps 4 in total. The four bonding bumps 4 are respectively arranged in a neighborhood of corner parts 2D, 2E, 2F, 2G.

The membrane is vibration film formed approximately in a circular-shape, and it is a thin-film made of an inorganic metal such as $SiO_2$, SiN or the like.

The all four bonding bumps 4 are solder bumps made of solder. As illustrated in FIG. 1, the four bonding bumps 4 are adhered to both the MEMS chip 10 and the package substrate 20. Namely, the four bonding bumps 4 are adhered to electrode pads 7, formed in the opposing surface 2a, and electrode pads 21 formed in a package surface 20a (surface of the MEMS chip 10 side of the package substrate 20) of the package substrate 20. The four bonding bumps 4 connect the MEMS chip 10 electrically and fixedly to the package substrate 20.

The particle filter 5 is a filter for keeping out the particles. The particle filter 5 is formed on the package surface 20a of the package substrate 20 so as to cover a sound hole 20b. The particle filter 5 is a film like member formed with polyamide or polyimide film. The particle filter 5 is formed in a modified rectangular shape which four corner parts are removed, as illustrated in FIG. 3, FIG. 4.

The particle filter 5 has a pierced-structure, which plural through holes 15 are formed on a base surface 16, being a surface of the film like member, by a regular arrangement, as illustrated in FIG. 4, FIG. 6. Each through hole 15 is a hole part which penetrates from the base surface 16 to the rear surface, as illustrated in FIG. 5, and an interval of the adjacent through holes 15 is a constant value. In FIG. 4, FIG. 6, FIG. 7, dots are shown in the base surface 16. Further, in case of the particle filter 5, a later-described plane-opening rate is set at least 50%.

Then, each through hole 15 is formed in a circular-shape in a plan view, in the particle filter 5. The diameter is approximately about 2 μm to 6 μm. Further, the thickness of the particle filter 5 is approximately about 1 μm to 6 μm. A thickness-opening rate is set at least 50%, and is set preferably 150%, in the particle filter 5.

Figure 28:
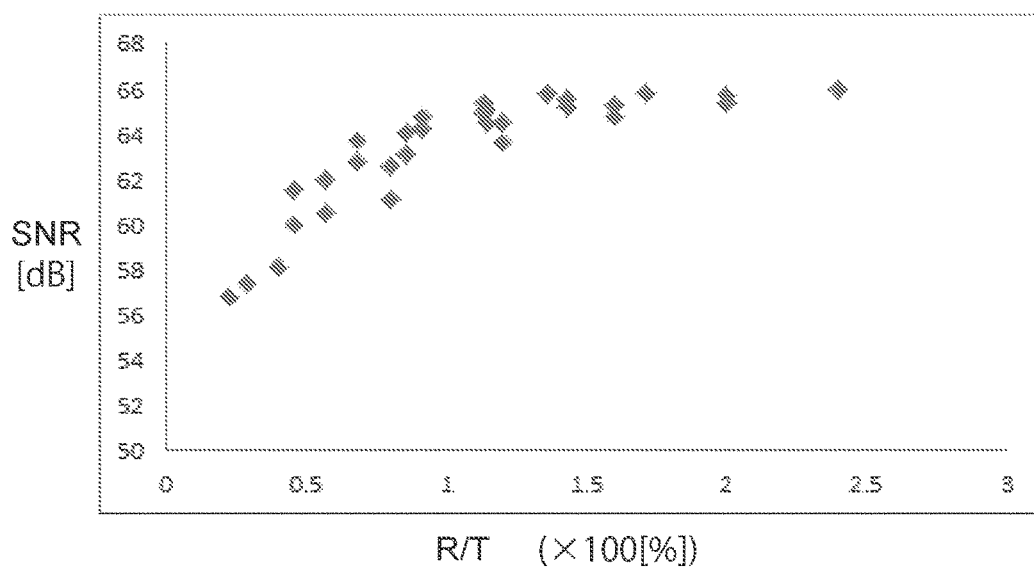
FIG. 28 is a graph being plotted relationships between R/T and SNR of the plural particle filters.

As for the thickness-opening rate, it is defined as the ratio (R/T) of the diameter (R) of the through hole 15 to the thickness (T) of the particle filter 5. Here, the relationships between R/T and SNR of the particle filters 5 are drawn in FIG. 28. FIG. 28 is a graph being plotted relationships between R/T and SNR of plural particle filters 5, horizontal axis shows R/T, vertical axis shows SNR. Plural particle filters 5, having different thickness (T) and diameter (R) of the through holes 15, are formed, and the relationship between R/T and SNR of each particle filter 5 is plotted. As illustrated in FIG. 28, when R/T increases, SNR also increases.

However, because even if R/T exceeds 1.5, SNR is almost constant about from 64 to 66, R/T is 1.5, namely, it is preferable that R/T is set 150%. Further, when R/T becomes 0.5, SNR becomes approximately 60, and when R/T becomes less than 0.5, SNR decrease greatly than 60. Therefore, R/T is 0.5, namely, it is preferable that R/T is set at least 50%.

Later-described plane-opening rate is data showing the easiness for air to pass through the particle filter 5 though, the thickness-opening rate is data showing the easiness for transmitting of vibration of air.

The particle filter 5 has a first through hole-group 15A and a second through hole-group 15B. Plural through holes 15, including a first through hole 15A1, through holes 15A2, 15A3 . . . , are included in the first through hole-group 15A. The first through hole 15A1 is arranged in a position which the interval to a peripheral end part 16e of the base surface 16 is set a first interval d1, and it is arranged the nearest position to the peripheral end part 16e among the through holes 15 included in the first through hole-group 15A. The first through hole 15A1, through holes 15A2, 15A3 . . . 15An are arranged at a constant interval in a straight line along with a direction intersecting vertically to the peripheral end part 16e to form a first line L1.

Plural through holes 15, including a second through hole 15B1, the through hole 15B2, the through hole 15Bn are included in the second through hole-group 15B. The second through hole 15B1 is arranged in a position which the interval to the peripheral end part 16e is set a second interval d2 larger than the first interval d1, and it is arranged the nearest position to the peripheral end part 16e among through holes 15 included in the second through hole-group 15B. The second through hole 15B1, through holes 15B2 . . . 15Bn are arranged at a constant interval in the direction intersecting vertically to the peripheral end part 16e to form a second line L2.

Then, in the particle filter 5, the first line L1 and the second line L2 are arranged alternately.

Further, the particle filter 5 is formed so that the center of the through hole 15 (for example, through hole 15B2, in FIG. 4), included in the second through hole-group 15B, is arranged between the centers of the adjacent through holes 15 (for example, through hole 15A2, through hole 15A3, in FIG. 4), included in the first through hole-group 15A.

Here, as for the plane-opening rate, it is defined as the ratio of the size of the plural through holes 15 to the size of the base surface 16. In detail, the plane-opening rate is set by the ratio of the following X2 to the following X1.

X1: the size of the polygon which at least three centers, of the adjacent representative through holes in the plural through holes 15, are vertexes X2: the size of the parts, arranged in the polygon, of the representative through holes Namely, how much is the size of the opened part to become the path of air in the particle filter 5, data showing the easiness for air to pass through is the plane-opening rate.

The through holes 15 become the path of air though, because the part between the adjacent through holes 15 is the base surface 16 (the part with dots in FIG. 4), the part does not become the path of air. Each through hole 15 is arranged regularly. Therefore, according to the size of the through holes 15 and regularity of their arrangement, the size of the polygon by the representative through holes and the size of the part which become the path of air are found, thereby the plane-opening rate is able to set.

Then, in case of the particle filter 5, as illustrated in FIG. 6, FIG. 7, three adjacent the through holes 15a, 15b, 15c are considered as the representative through holes. The centers of the through holes 15a, 15b, 15c are a0, b0, c0 though, the triangle, which these centers are vertexes, is a regular triangle, according to the regularity of the arrangement of the through holes 15.

When the radius of the through holes 15a, 15b, 15c are r, and each interval of the though holes 15a, 15b, 15c are a, the area S1 of the triangle (ΔABC), which the centers a0, b0, c0 are vertexes, $$S1 = (2r+a) \times ((2r+a) \times ((\sqrt{3})/2))/2$$
$$= \sqrt{3}(2r+a)^2/4$$

Further, the part, arranged in the ΔABC, of though holes 15a, 15b, 15c, are respectively sectors PA, PB, PC, and the area S2 of these all sectors PA, PB, PC, $$S2 = \pi r^2/6$$

Therefore, the area S3 of the part which dots are not illustrated (namely, opened part)

$$S3 = (\pi r^2/6) \times 3 = \pi r^2/2$$

Therefore, the plane-opening rate (OR1) is, $$OR1 = S3/S1$$
$$= (\pi r^2/2)/(\sqrt{3}(2r+a)^2/4)$$
$$= \pi r^2/(\sqrt{3}(2r+a)^2/2)$$

When the above OR1 is set at least 45%, $$\pi r^2/(\sqrt{3}(2r+a)^2/2) \geq (1/2) \times 0.9$$

Namely, it is sufficient that $\pi r^2 \geq (\sqrt{3}(2r+a)^2/4) \times 0.9$     equation (1)

The left side of the equation (1) means area of the through hole 15. Further, the right side of the equation (1) means 90% area of the ΔABC. Accordingly, in case of the particle filter 5, the area of the through hole 15 is greater than or equal to the 90% area of the ΔABC so that the plane-opening rate is set at least 45%. Here, ΔABC is a regular triangle which the centers a0, b0, c0 of the adjacent plural through holes 15 (15a, 15b, 15c), including both the through hole 15, included in the first through hole-group 15A, and the through hole 15, included in the second through hole-group 15B, are vertexes.

The ASIC package 91 has an ASIC 92, the package substrate 20 which the ASIC 92 is adhered, and the bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93.

The package substrate 20 is a board like member made of such as silicon, ceramic or the like (or PCB: Printed Circuit Board). The electrode pads 21 and electrode pads 12 are formed on the package surface 20a of the package substrate 20. The MEMS package 1 is mounted on the part, of the package surface 20a, which the electrode pads 21 are formed, the ASIC package 91 is mounted on the part which the electrode pads 12 are formed. Further, a sound hole 20b is formed on the part, of the package substrate 20, which the MEMS package 1 is mounted. The sound hole 20b penetrates the package substrate 20 from the package surface 20a to a bottom surface 20c on the opposite side.

The cap 99 covers the MEMS package 1 and the ASIC package 91, and it is adhered to the package surface 20a with not illustrated adhesive (or by soldering). A space 99A is secured by the cap 99 and the package substrate 20, the MEMS package 1 and the ASIC package 91 are accommodated in the space 99A.

(Method of Manufacturing the MEMS Package)

Figure 8:
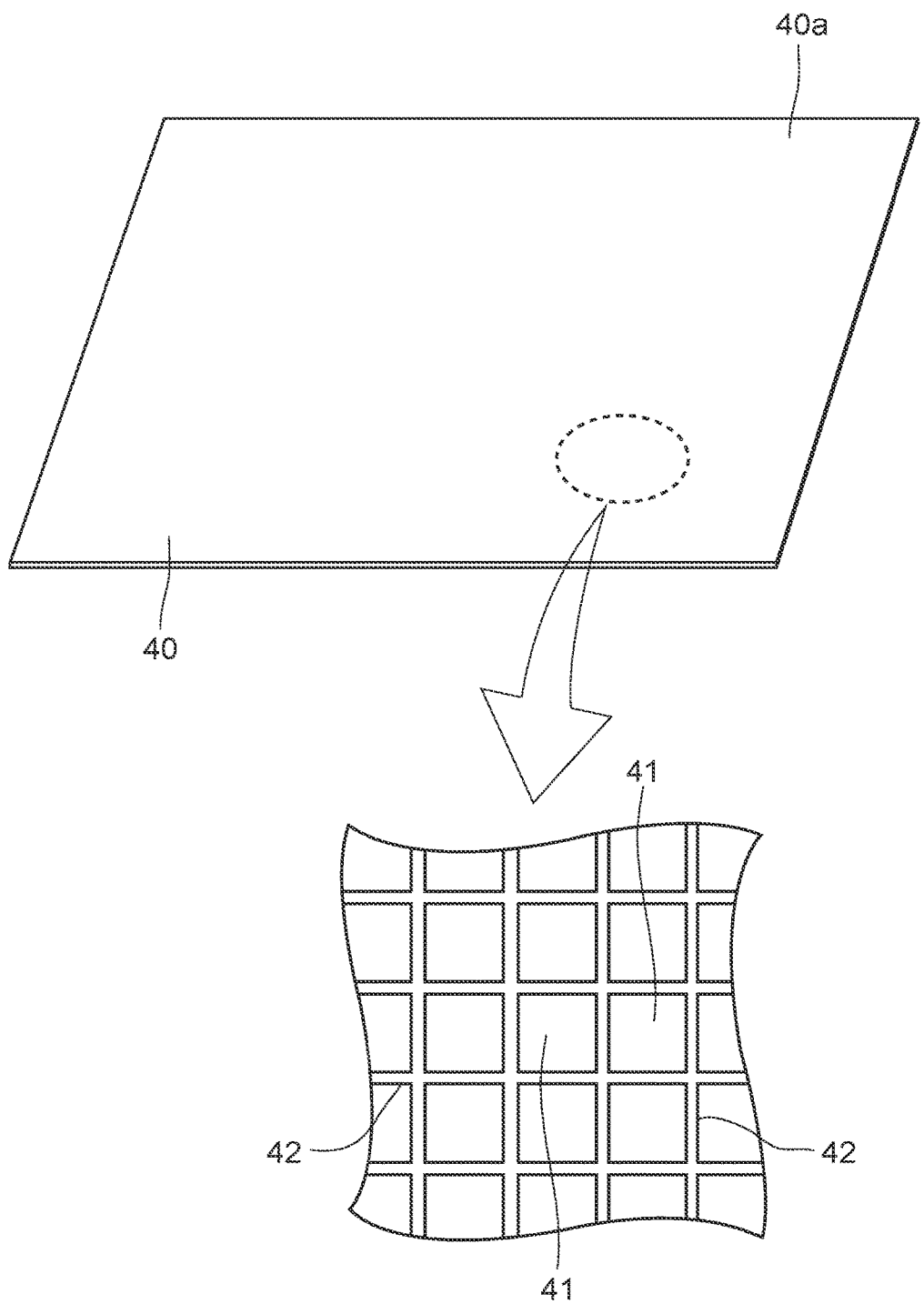
FIG. 8 is a perspective view showing a package-panel according to the first embodiment of the present invention.
Figure 9:
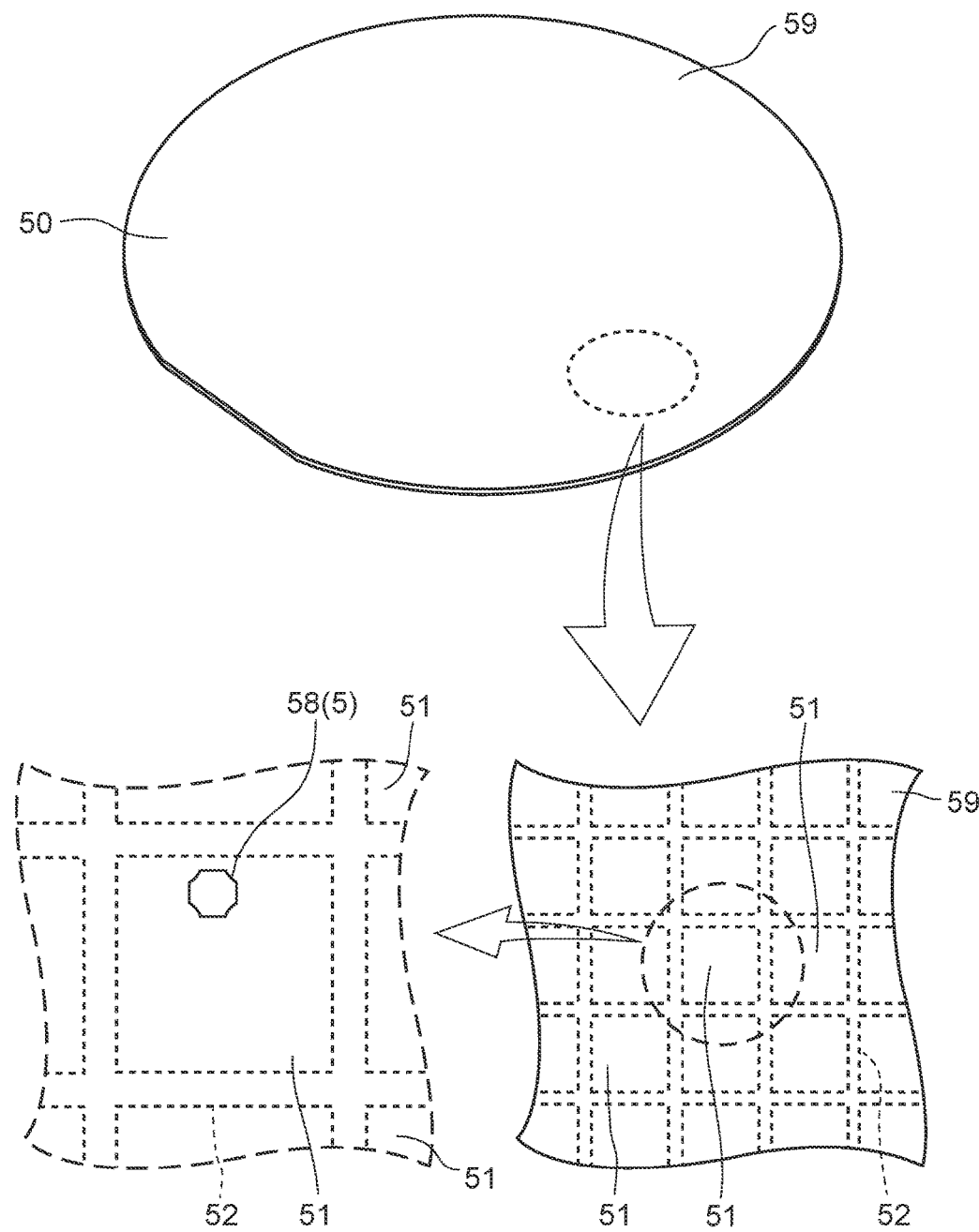
FIG. 9 is a perspective view showing a filter-wafer according to the first embodiment of the present invention.

Subsequently, the method of manufacturing the MEMS package 1, having the above structure, will be explained with reference to FIG. 8 to FIG. 17. Here, FIG. 8 is a perspective view showing the later-described package-panel 40, FIG. 9 is a perspective view showing the later-described filter-wafer 50. FIGS. 10-13 are a sectional view showing a principal part of a filter-wafer manufacturing step which the filter-wafer 50 is manufactured, FIGS. 14-17 are a sectional view showing a principal part of a photosensitive-adhesive layer forming step, a filter-layer removing step, a filter-layer transcribing step.

In the Method of manufacturing the MEMS package 1, the MEMS package 1 is manufactured with the above-mentioned MEMS chip 10 and the package substrate 20 which the MEMS chip 10 is adhered. In case of the method of manufacturing according to the embodiment, the MEMS chip 10 (rectangular MEMS chip), having the rectangular element substrate 2, is used. In the Method of manufacturing the MEMS package 1, the package-panel 40, illustrated in FIG. 8, and the filter-wafer 50, as illustrated in FIG. 9, are used.

The package-panel 40 is a board-like member, having rectangular shape, made of PCB or ceramic, and plural package-regions 41 are formed on the surface 40a by a regular arrangement. When the package-panel 40 is divided along with divided lines 42, the package substrate 20 is manufactured from each package region 41 (about 600 package substrates 20 are manufactured by every package-panel 40).

The filter-wafer 50 is formed with a semiconductor wafer 49 (see FIG. 10 or the like) made of silicon. A filter-layer 59 is formed on the semiconductor wafer 49, thereby the filter-wafer 50 is manufactured. The filter-wafer manufacturing step is performed to manufacture the filter-wafer 50.

A filter-wafer manufacturing step, a photosensitive-adhesive layer forming step, a filter-layer removing step and a filter-layer transcribing step are included in the Method of manufacturing the MEMS package 1.

A thermal-removal layer forming step and a filter-layer forming step are included in the filter-wafer manufacturing step.

Figure 10:
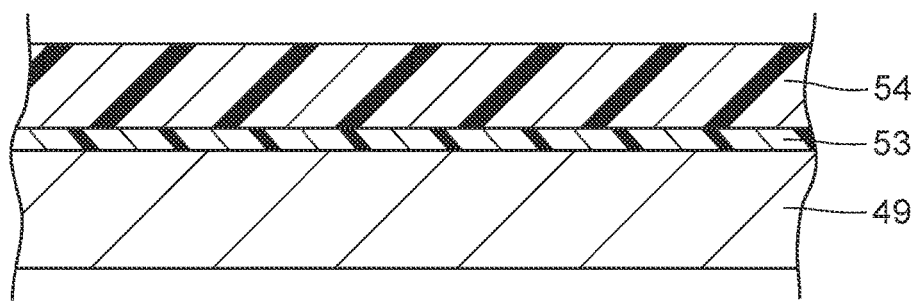
FIG. 10 is a sectional view showing a principal part of a filter-wafer manufacturing step according to the first embodiment of the present invention.

In the thermal-removal layer forming step, at first, the semiconductor wafer 49 is prepared. Then, as illustrated in FIG. 10, thermal-foaming resin is applied on the surface of the semiconductor wafer 49 to form a thermal-foaming resin layer is formed. Resin and foaming agent are included in thermal-foaming resin. Thermal-foaming resin generates gas by heating to be able to foam. When the thermal-foaming resin is applied to form the thermal-foaming resin layer, the thermal-foaming resin layer becomes a thermal-removal layer 53, being removed by heating. Further, it is possible that the thermal-foaming resin layer is formed by sticking a thermal-foaming resin sheet which thermal-foaming resin is processed to a sheet-like form. Concretely, the thermal-removal layer 53 is formed by applying a thermal-removal sheet, being removed by heating.

Subsequently, the filter-layer forming step is performed. In the filter-layer forming step, at first, a resin layer 54 is formed on the thermal-removal layer 53 with polyamide or polyimide film.

Figure 11:
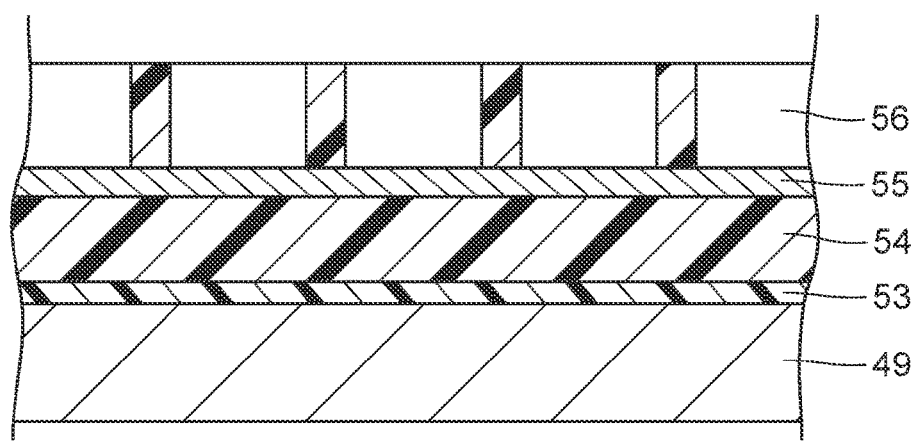
FIG. 11 is a sectional view showing a principal part of the manufacturing step subsequent to that in FIG. 10.
Figure 12:
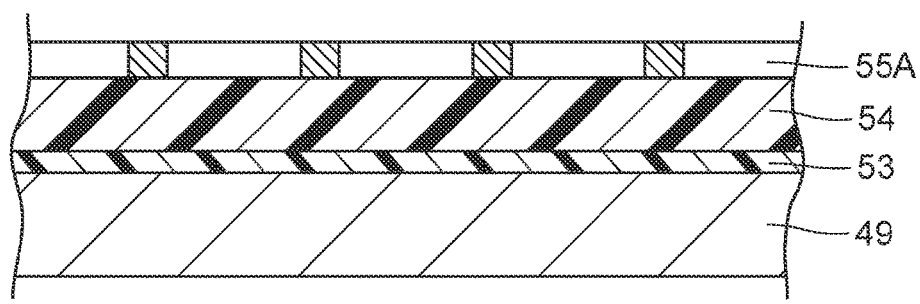
FIG. 12 is a sectional view showing a principal part of the manufacturing step subsequent to that in FIG. 11.

Next, as illustrated in FIG. 11, a metal layer 55 is formed on the resin layer 54 with titanium (Ti). Further, photoresist is applied on the surface of the metal layer 55, after that, an exposure is performed with not-illustrated photomask, further a resist pattern 56 is formed by a development. Next, a milling by Ar is performed to the metal layer 55 with the resist pattern 56 as a mask. Then, as illustrated in FIG. 12, an unnecessary part of the metal layer 55 is removed to form a metal pattern 55A. The metal pattern 55A is formed by a pattern in accordance with a filter-layer 59, being formed later.

Figure 13:
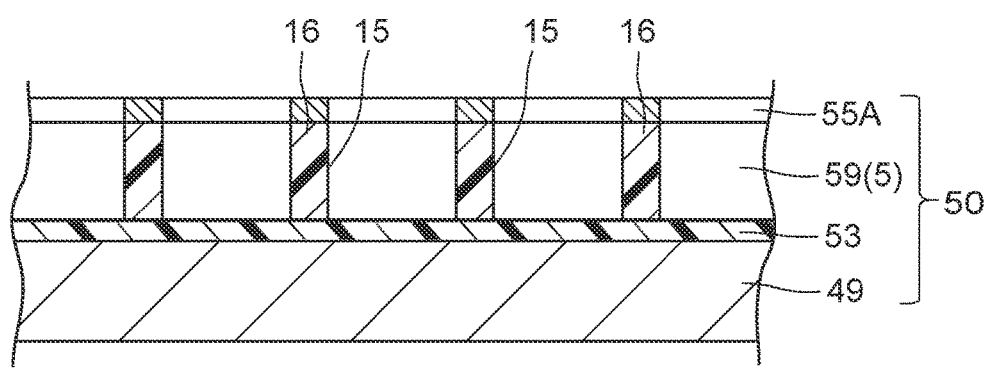
FIG. 13 is a sectional view showing a principal part of the manufacturing step subsequent to that in FIG. 12.

Then, reactive ion etching (RIE) is performed to the resin layer 54, with the metal pattern 55A as a mask. Then, an unnecessary part of the resin layer 54 is removed to form the filter-layer 59 on the thermal-removal layer 53, as illustrated in FIG. 13. In this way, the filter-wafer 50 is manufactured.

Plural filter-regions 51 are formed by the regular arrangement in accordance with the package-regions 41 in the filter-layer 59. Dividing lines 52, in accordance with the dividing lines 42, are arranged between the respective filter-regions 51. A filter-part 58 is arranged in the respective filter-region 51, as illustrated in FIG. 9. Because each filter-part 58 becomes the above-described particle filter 5 later, plural through holes 15, common with the particle filter 5, are formed in the each filter-part 58. The filter-part 58 is formed in the modified rectangular shape in accordance with the particle filter 5.

Figure 14:
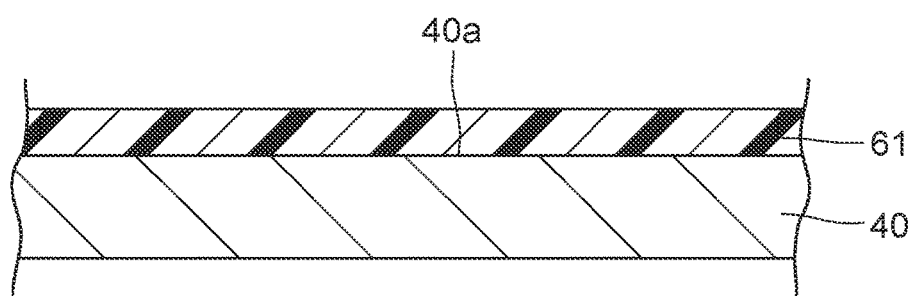
FIG. 14 is a sectional view showing a principal part of a photosensitive-adhesive layer forming step according to the first embodiment of the present invention.
Figure 16:
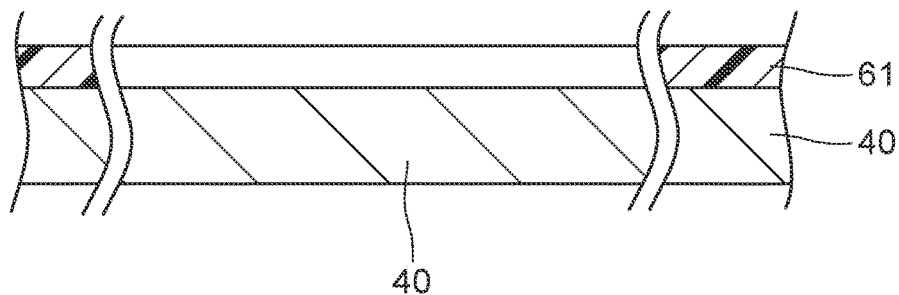
FIG. 16 is a sectional view showing another principal part of a photosensitive-adhesive layer forming step according to the first embodiment of the present invention.

On the other hand, in the photosensitive-adhesive layer forming step, as illustrated in FIG. 14, a photosensitive-adhesive layer 61 is formed on the surface 40a of the package-panel 40. The photosensitive-adhesive layer 61 is formed by applying photosensitive polyimide adhesive sheet and so on. In this case, as illustrated in FIG. 16, the photosensitive-adhesive layer 61 is formed in a hole-formed structure. In the hole-formed structure, a part, which the sound hole 20b will be formed later, is removed.

Then, in the filter-layer removing step, at first, the filter-wafer 50 is heated.

Figure 15:
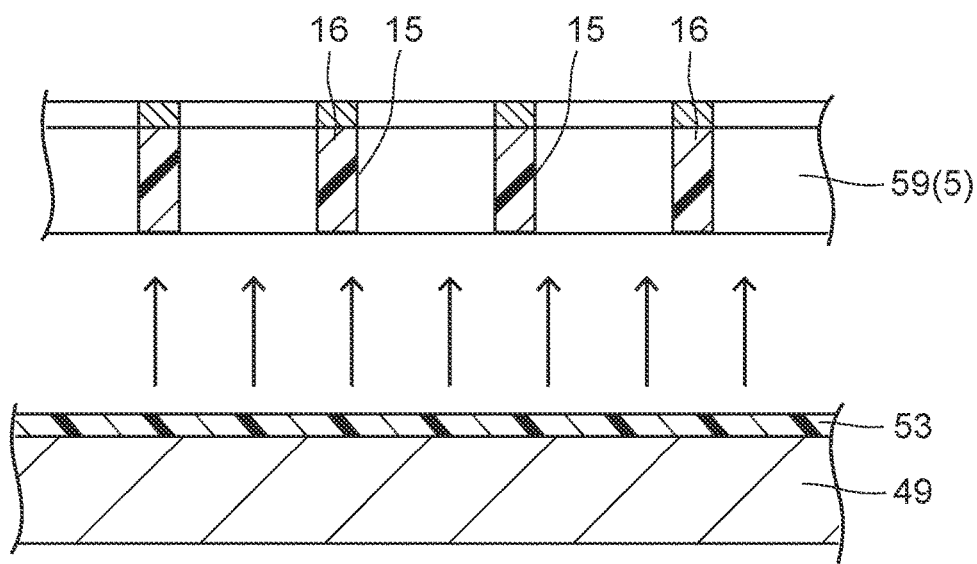
FIG. 15 is a sectional view showing a principal part of a filter-layer removing step according to the first embodiment of the present invention.

Then, as illustrated in FIG. 15, the thermal-removal layer 53 is foamed by that heat. Therefore, the filter-layer 59 is removed from the thermal-removal layer 53.

Figure 17:
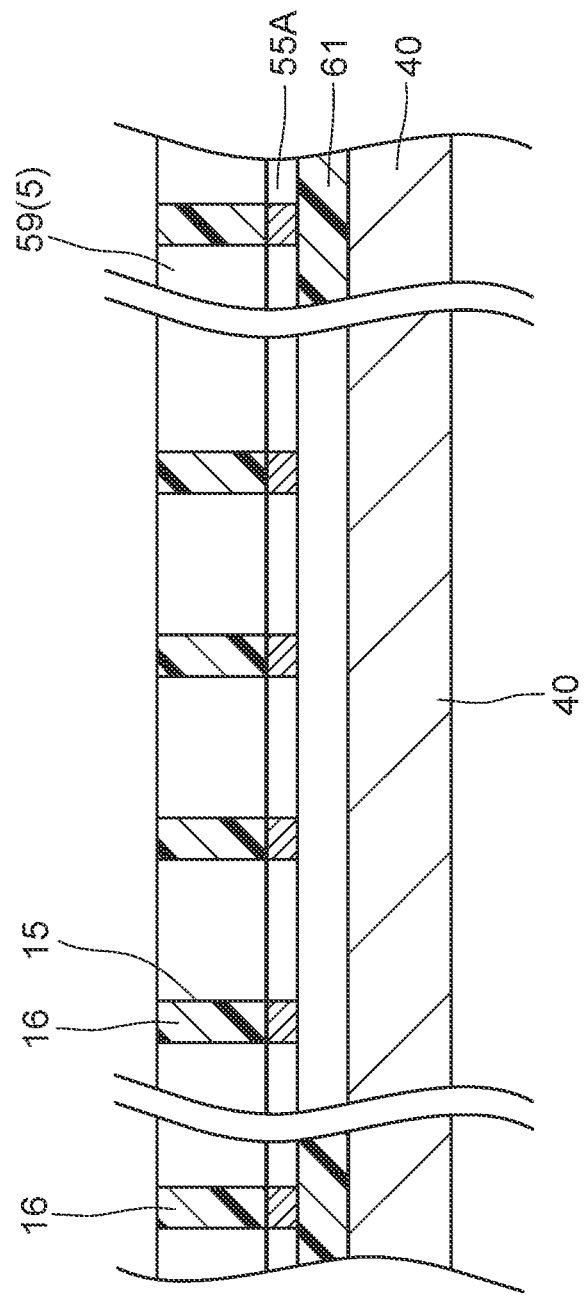
FIG. 17 is a sectional view showing a principal part of a filter-layer transcribing step according to the first embodiment of the present invention.

Subsequently, the filter-layer transcribing step is performed. As described above, because the photosensitive-adhesive layer 61 is formed on the surface 40a of the package-panel 40, as illustrated in FIG. 17, the filter-layer 59, removed from the semiconductor wafer 49, is laminated on the photosensitive-adhesive layer 61. Then, because plural package-regions 41 are formed on the package-panel 40, in each package-region 41, unnecessary parts of the filter-layer 59 are removed by a laser-processing. In this case, in each package-region 41, the part, covering the sound hole 20b, of the filter-layer 59, are saved, another parts are removed. In this way, the filter-layer 59 is transcribed on the package-panel 40.

After that, a hydrophobicity-applying step is performed. In the hydrophobicity-applying step, the package-panel 40, which the filter-layer 59 are transcribed, was put in the not-illustrated vessel (also referred a hydrophobic-vessel), having gas phase of raw materials used for hydrophobicity-applying. Steam made from raw materials used for hydrophobicity-applying (also referred hydrophobic-gas) was included in the hydrophobic-vessel. Materials including alkylsilane are used as raw materials (see Japan patent 3974574, in detail, also referred patent document 6). When the hydrophobicity-applying step is performed, hydrophobicity is applied to the package-panel 40 which the filter-layer 59 is transcribed.

Further, in the hydrophobicity-applying step, a later-described panel-with-chip 40X is able to be put in the hydrophobic-vessel, instead of the package-panel 40 which the filter-layer 59 is transcribed. Thereby, hydrophobicity is able to be applied to both the filter-layer 59 and the membrane 3 (further back-plates).

Figure 32:
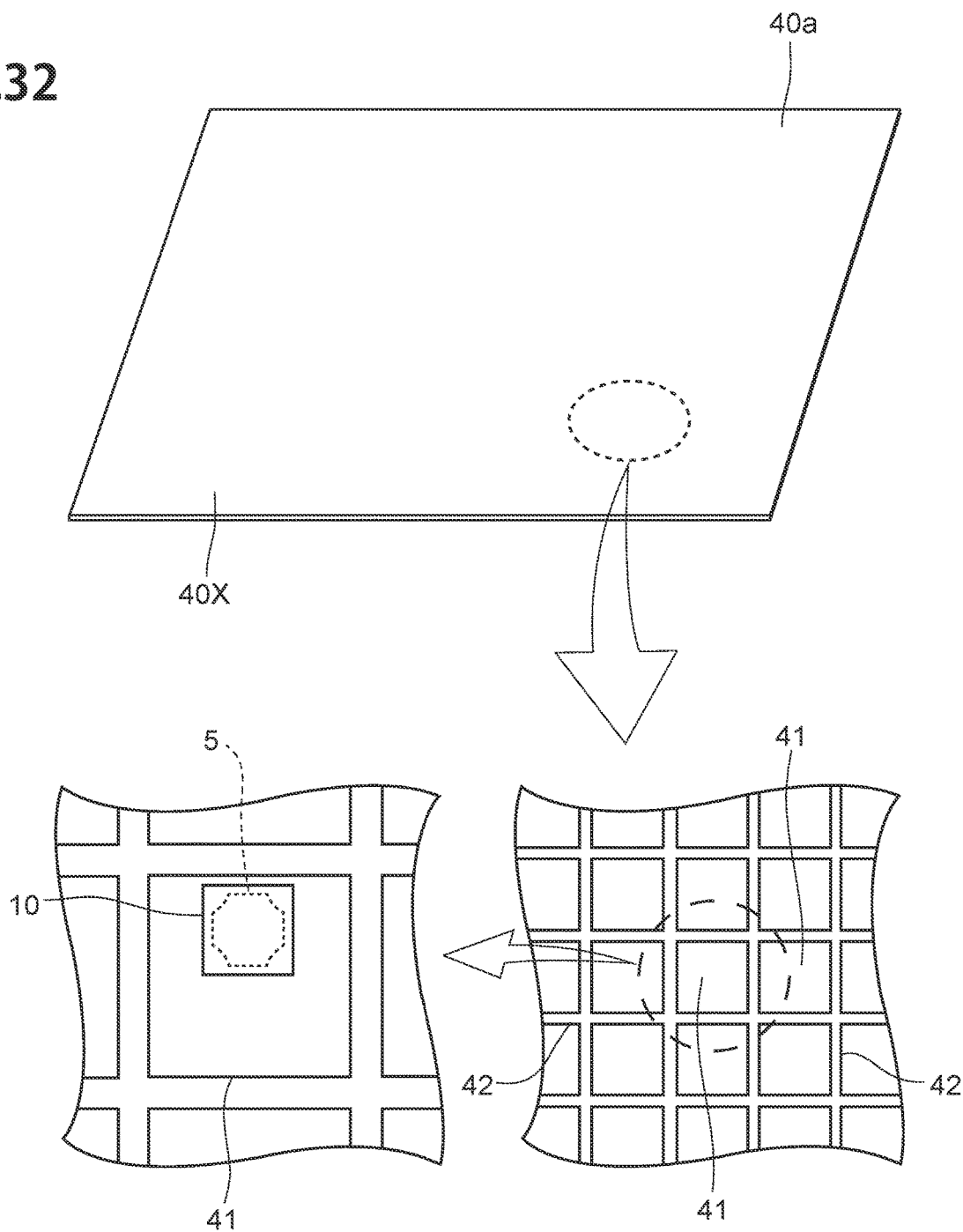
FIG. 32 is a sectional view showing a panel-with-chip according to the first embodiment of the present invention.

After that, the MEMS chip mounting step is performed. In the MEMS chip mounting step, the electrode pads 7 are formed on the MEMS chip 10, further the solder bumps are formed. After that, in the package-panel 40, the MEMS chips 10 are mounted respectively on the package-regions 41 by the flip chip bonding with solder bumps to form the panel-with-chip 40X (see FIG. 32). The panel-with-chip 40X is put into the not-illustrated heating reflow furnace. Then the solder bumps become the bonding bumps 4 after melting. After that, the sound shield 6 is formed (the sound shield 6 is sometimes formed before the MEMS chips 10 are mounted). The MEMS package 1 is manufactured by performing the above-mentioned steps.

Subsequently, the ASIC package 91 is mounted on the panel-with-chip 40X, further the cap 99 is covered. Note that a package reflow is able to be performed about both the MEMS chip 10 and ASIC package 91, when the ASIC package 91 is mounted on the panel-with-chip 40X.

Furthermore, a panel cutting step is performed. In the panel cutting step, the panel-with-chip 40X, which the MEMS chip 10 and ASIC package 91 are mounted further the cap 99 is covered, is cut along with the divided lines 42 to be divided into the respective package-regions 41. Then, the panel-with-chip 40X is divided into the plural package-regions 41. The MEMS microphone 100 is manufactured together with the package substrate 20 from the respective package-regions 41. The above-described particle filter 5 is formed in the manufactured package substrate 20.

(Operation and Effect of the MEMS Package)

As mentioned above, the particle filter 5 is formed on the package substrate 20 of the MEMS package 1. Because the particle filter 5 is formed to cover the sound hole 20b, the particles are able to be kept out by the particle filter 5. The plural through holes 15 are formed in the particle filter 5, the diameter of each through hole 15 is approximately about 2 μm to 6 μm. Therefore, the particles are able to be kept out surely by the particle filter 5.

Moreover, in case of the particle filter 5, because the plane-opening rate is set at least 45%, about half of the particle filter 5 become the path of air. Therefore, the path of air is surely secured even if the particle filter 5 is formed. Accordingly, the particles are effectively kept out with avoiding the decline of the sensitivity and mic characteristic. Further, because the particle filter 5 is also kept on the package substrate 20 even if the MEMS chip 10 is mounted on the package substrate 20, the particles are effectively kept out after the MEMS chip is mounted on the package substrate 20.

Especially, the particle filter 5 is formed so that the center of the through hole 15, included in the second through hole-group 15B, is arranged between the centers of the adjacent through holes 15, included in the first through hole-group 15A. Therefore, in the particle filter 5, there is no waste in the arrangement of the through holes 15, the path of air is effectively secured.

Further, because the thickness-opening rate is set at least 50%, the particle filter 5 has the structure which their thickness is thin (preferably, the thickness is thinner than the diameter of the through hole 15).

The conventional particle filter, disclosed in the patent document 5, has a board-like structure which their thickness is thicker than the size of the through hole. Therefore, the conventional particle filter prevents air from vibrating, this thing makes sensitivity (or SNR) of microphone lower greatly.

On the contrary, because the particle filter 5 has a structure which their thickness is thinner (preferably thinner than the diameter of the through hole 15), the particle filter 5 hardly disturbs vibration of air. Therefore, the MEMS package 1 is able to avoid the decline of the sensitivity, mic characteristic in the membrane 3.

On the other hand, because the path of air is effectively secured in the particle filter 5, moisture can enter through the particle filter 5 from outside. When moisture can enter from outside, the membrane 3 adheres to the back-plates with that moisture, thereby the function as the capacitor can be lost.

However, in the MEMS package 1, because hydrophobicity is applied to the package substrate 20, part of the path of moisture keeps off moisture. Therefore, moisture never enter into the membrane 3 and the back-plates. Further, hydrophobicity is applied with hydrophobic-gas, the particle filter 5 can not be damaged.

Further, in the Method of manufacturing the MEMS package 1, the filter-wafer 50 is used. The filter-layer 59 is formed on the semiconductor wafer 49 to manufacture the filter-wafer 50. The filter-layer 59 of the filter-wafer 50 is transcribe to the package-panel 40, after that the semiconductor wafer 49, used as the filter-wafer 50, remains. The filter-layer 59 is formed on that semiconductor wafer 49 again, by this, the filter-wafer 50 cam be obtained again. Accordingly, in the Method of manufacturing the MEMS package 1, the semiconductor wafer 49 is reusable. Therefore, there is no waste in materials for manufacturing the MEMS package 1, thereby manufacturing cost can be lowered.

MODIFIED EXAMPLE

Figure 18:
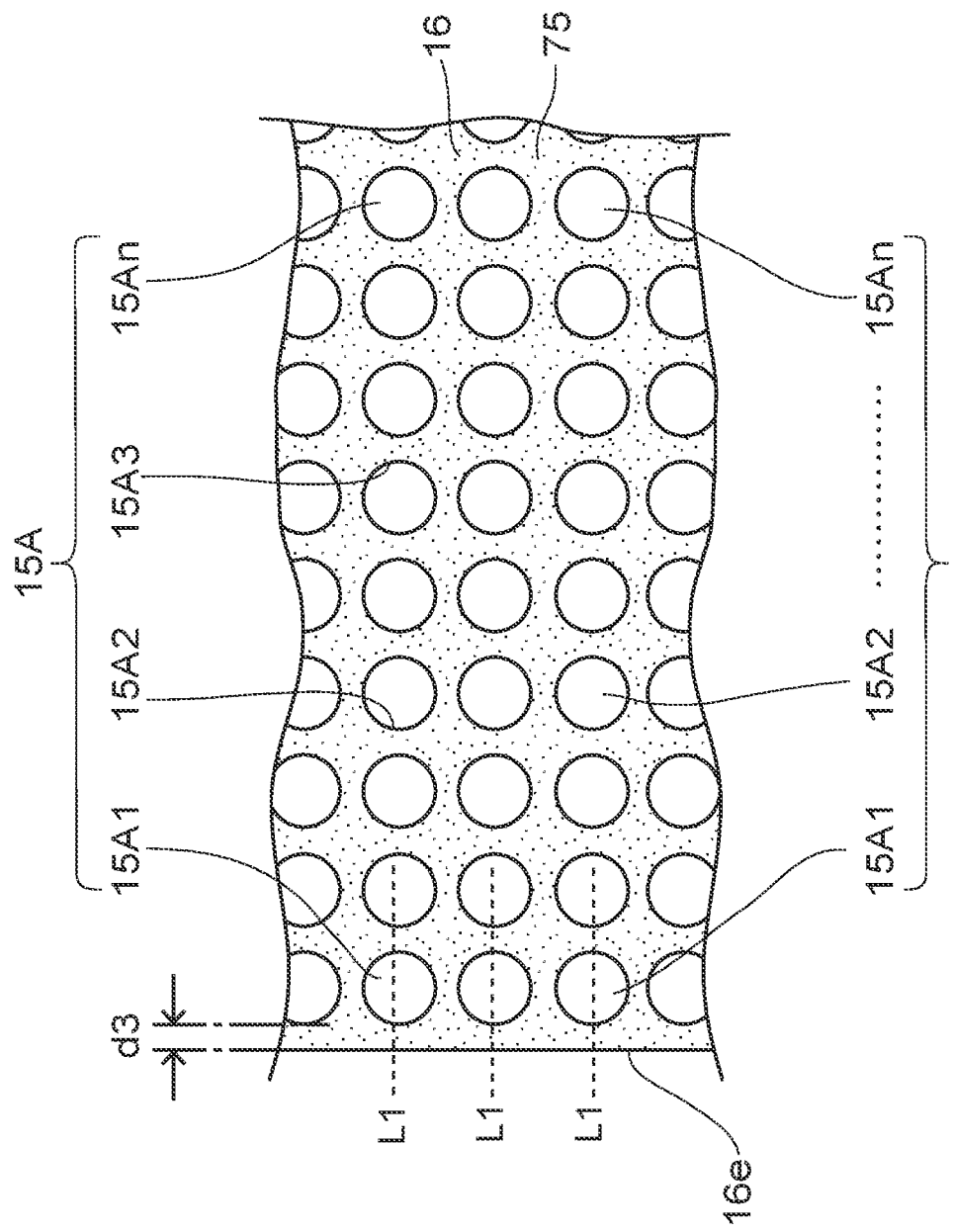
FIG. 18 is a plan view showing a principal part of the particle filter according to a modified example.
Figure 19:
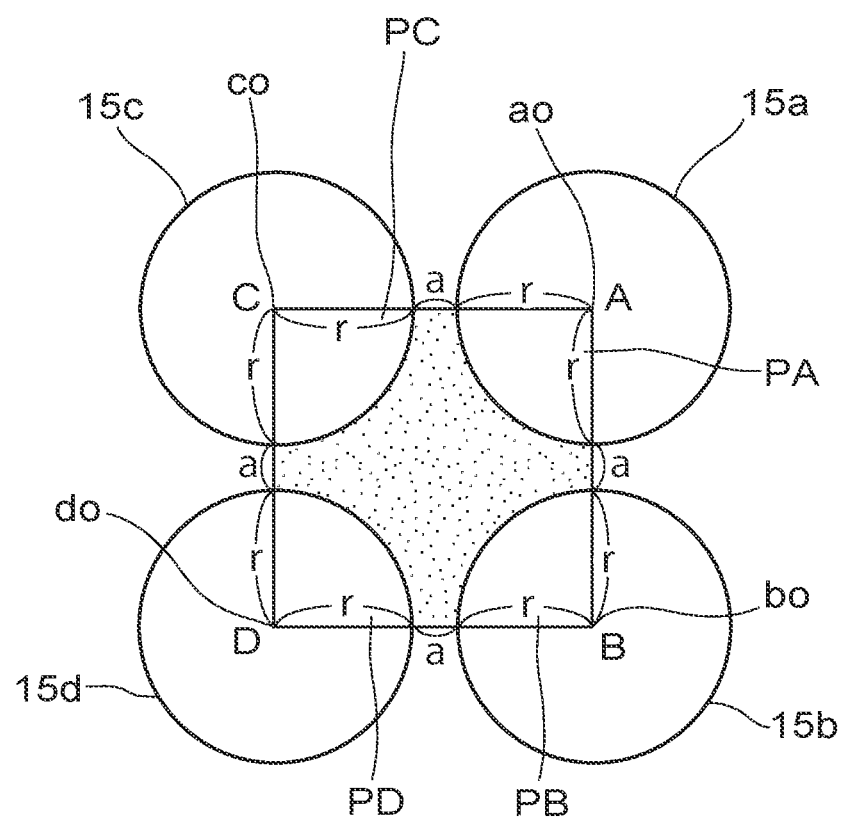
FIG. 19 is a plan view showing a part, including representative through holes, of the particle filter according to a modified example.

Next, the particle filter 75, according to a modified example, is explained with reference to FIG. 18, FIG. 19. FIG. 18 is a plan view showing a principal part of the particle filter 75 according to the modified example, FIG. 19 is a plan view showing a part, including representative through holes 15a, 15b, 15c, 15d, of the particle filter 75 according to the modified example.

The particle filter 75 is different in that it has the first through hole-group 15A though, and it does not have the second through hole-group 15B, as compared with the particle filter 5. Because the particle filter 75 does not have the second through hole-group 15B, the plural first lines L1 are arranged. Further, the first through hole 15A1, through holes 15A2, 15A3 . . . 15An, included in the each through hole-group 15A, are arranged at a constant interval in a straight line along with the direction intersecting vertically to the peripheral end part 16e. Furthermore, the plural first through holes 15A1, included in the each first line L1, are arranged at a constant interval in a straight line along with the peripheral end part 16e (similar with the through holes 15A2, 15A3 . . . 15An). All intervals between the first through holes 15A1 and the peripheral end part 16e are set constantly an end-interval d3. The first through hole 15A1 is corresponding to an end-through hole.

In case of the particle filter 75, the plane-opening rate is also set at least 45%, the thickness-opening rate is also set at least 50%. In this case, as illustrated in FIG. 19, the adjacent four through holes 15a, 15b, 15c, 15d are set as the representative through holes. The centers of the through holes 15a, 15b, 15c, 15d are a0, b0, c0, d0 though, a rectangular, which these centers are vertexes, is a square. When the radius of the through holes 15a, 15b, 15c, 15d are r, and each interval of the though holes 15a, 15b, 15c, 15d are a, area S4 of the square (□ABCD), which the centers a0, b0, c0, d0 are vertexes, $$S4=(2r+a)^2$$

Further, the part, arranged in the □ABCD, of though holes 15a, 15b, 15c, 15d, are respectively sectors PA, PB, PC, PD, and area S5 of these all sectors PA, PB, PC, PD, $$S5=\pi r^2/4$$

Therefore, area S6 of the part, in the □ABCD, which dots are not illustrated (namely, opened part)

$$S6=(\pi r^2/4)\times 4=\pi r^2$$

Therefore, the plane-opening rate (OR2) is, $$OR2 = S6/S4$$
$$= \pi r^2 / (2r + a)^2$$

When the above OR2 is set at least 45%, $$\pi r^2/(2r+a)^2 \geq (\tfrac{1}{2})\times 0.9$$

Namely, it is sufficient that $\pi r^2 \geq ((2r+a)^2/2)\times 0.9$ equation (2)

The left side of the equation (2) means area of the through hole 15. Further, the right side of the equation (2) means 90% of half area of the □ABCD (namely, 45% of the area). Accordingly, in case of the particle filter 75, the area of the through hole 15 is greater than or equal to 45% of the area of the □ABCD so that the plane-opening rate is set at least 45%. Here, □ABCD is the square which the centers a0, b0, c0, d0, of the adjacent plural through holes 15 (15a, 15b, 15c, 15d) included in the adjacent two first through hole-groups 15A, are vertexes.

In case of the particle filter 75, because the plane-opening rate is set at least 45%, and the thickness-opening rate is set at least 50%, similar with the particle filter 5. Therefore, the package substrate 20, which the particle filter 75 is formed, also exhibits operation and effect similar with the case which the particle filter 5 is formed.

Second Embodiment

Next, the structure of the MEMS package 101 according to the second embodiment of the present invention will be explained with reference to FIG. 20. Here, FIG. 20 is a sectional view corresponding to FIG. 1, showing the MEMS microphone 200 having the MEMS package 101.

Figure 20:
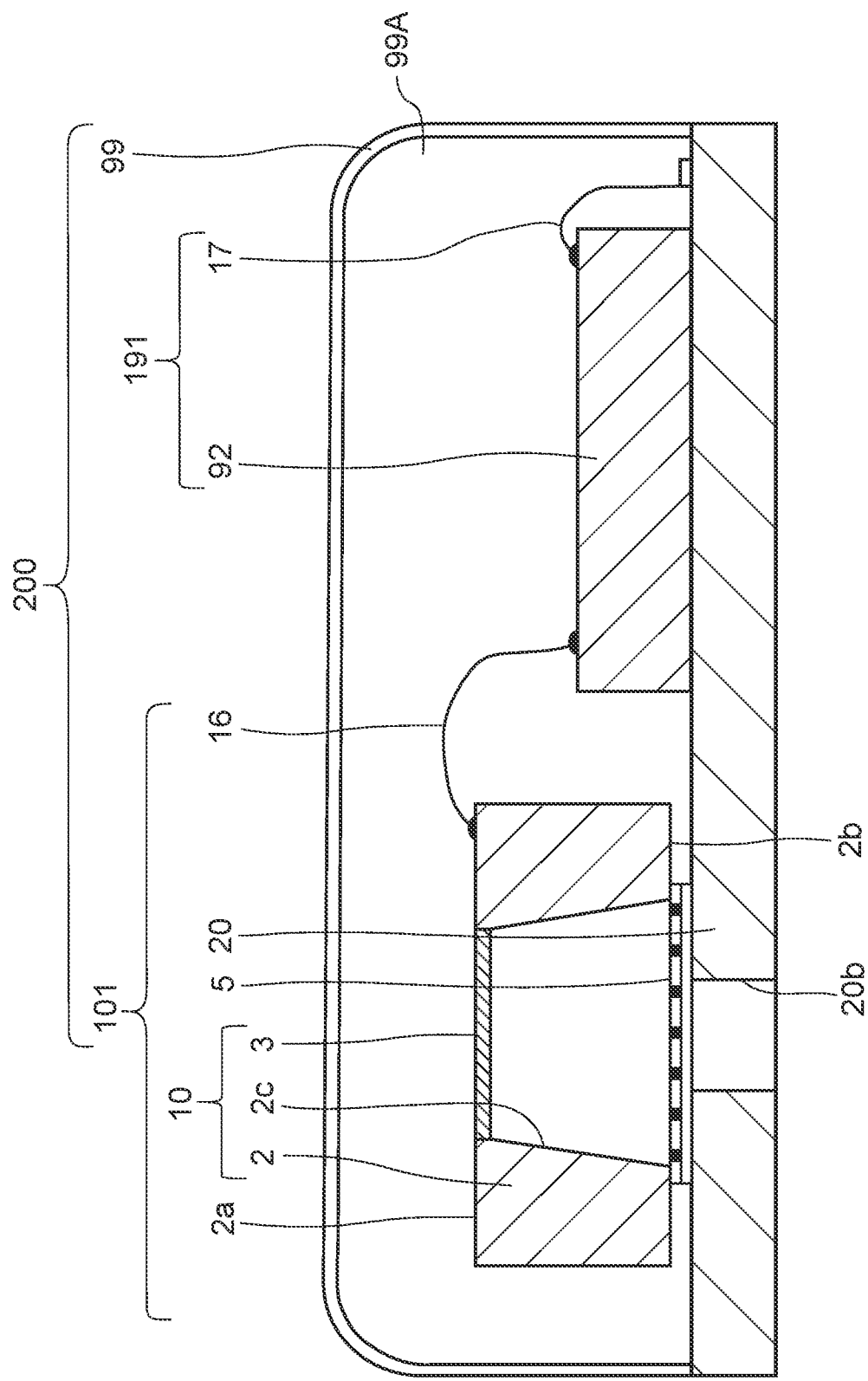
FIG. 20 is a sectional view corresponding to FIG. 1, showing a MEMS microphone having the MEMS package according to the second embodiment of the present invention.

As illustrated in FIG. 20, the MEMS microphone 200 has the MEMS package 101, the ASIC package 191 and the cap 99.

In case of the MEMS microphone 100 according to the first embodiment, the MEMS package 1 and the ASIC package 91 are mounted on the package substrate 20 by the flip chip bonding.

On the contrary, in case of the MEMS microphone 200 according to the second embodiment, the MEMS package 101 and the ASIC package 191 are mounted on the package substrate 20 by the wire bonding.

Then, the MEMS package 101 is different in that the particle filter 5 is formed on the MEMS chip 10, and it does not have the bonding bumps 4, the sound hole 6, the electrode pads 7, 21, and the MEMS chip 10 is connected to the ASIC 92 by the wire 16, as compared with the MEMS package 1.

The ASIC package 191 is different in that it is connected to the package substrate 20 by the wire 17 not by the bonding bumps 93, as compared with the ASIC package 91.

(Method of Manufacturing the MEMS Package)

Figure 21:
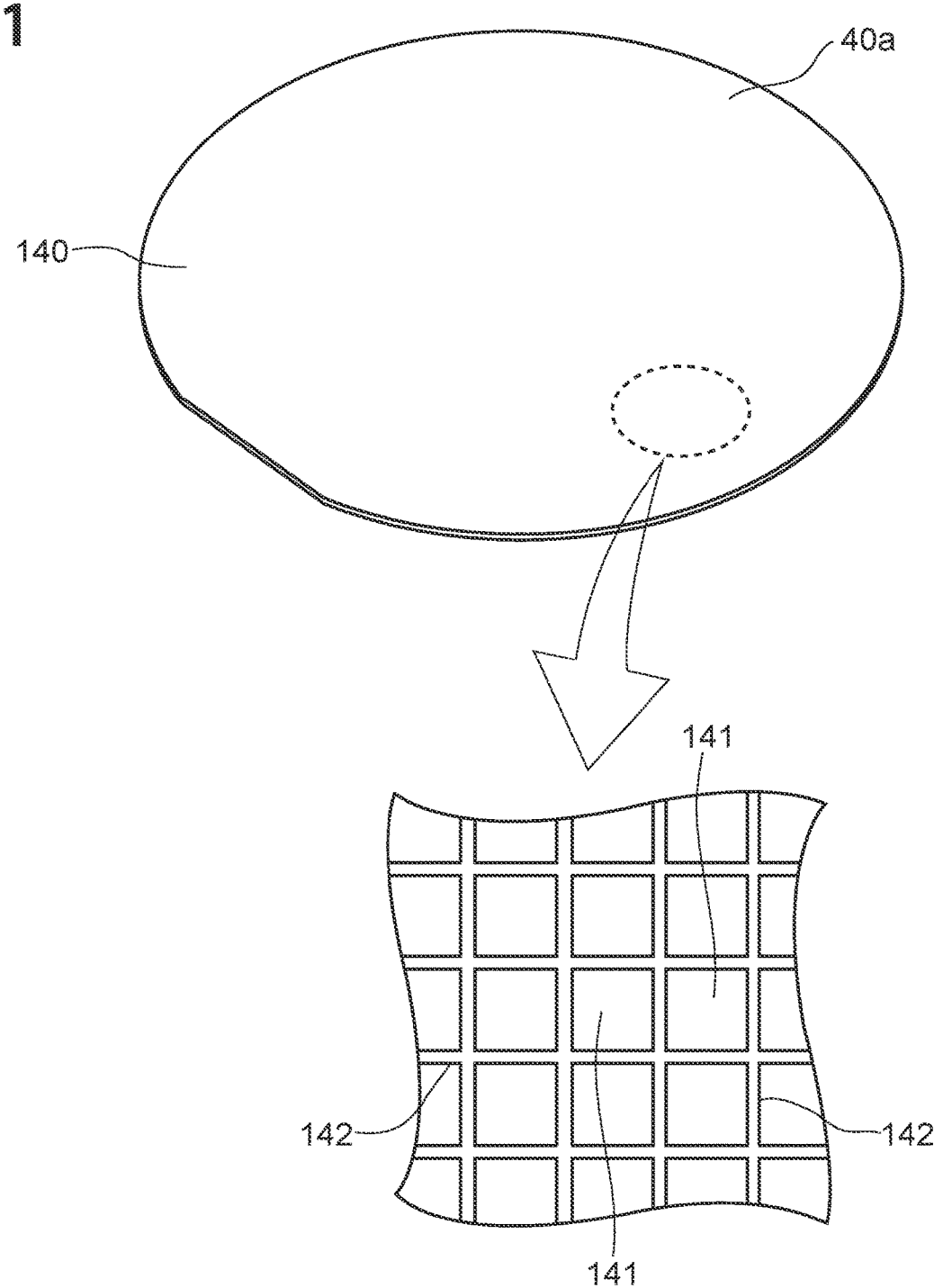
FIG. 21 is a perspective view showing a MEMS-wafer according to the second embodiment of the present invention.
Figure 22:
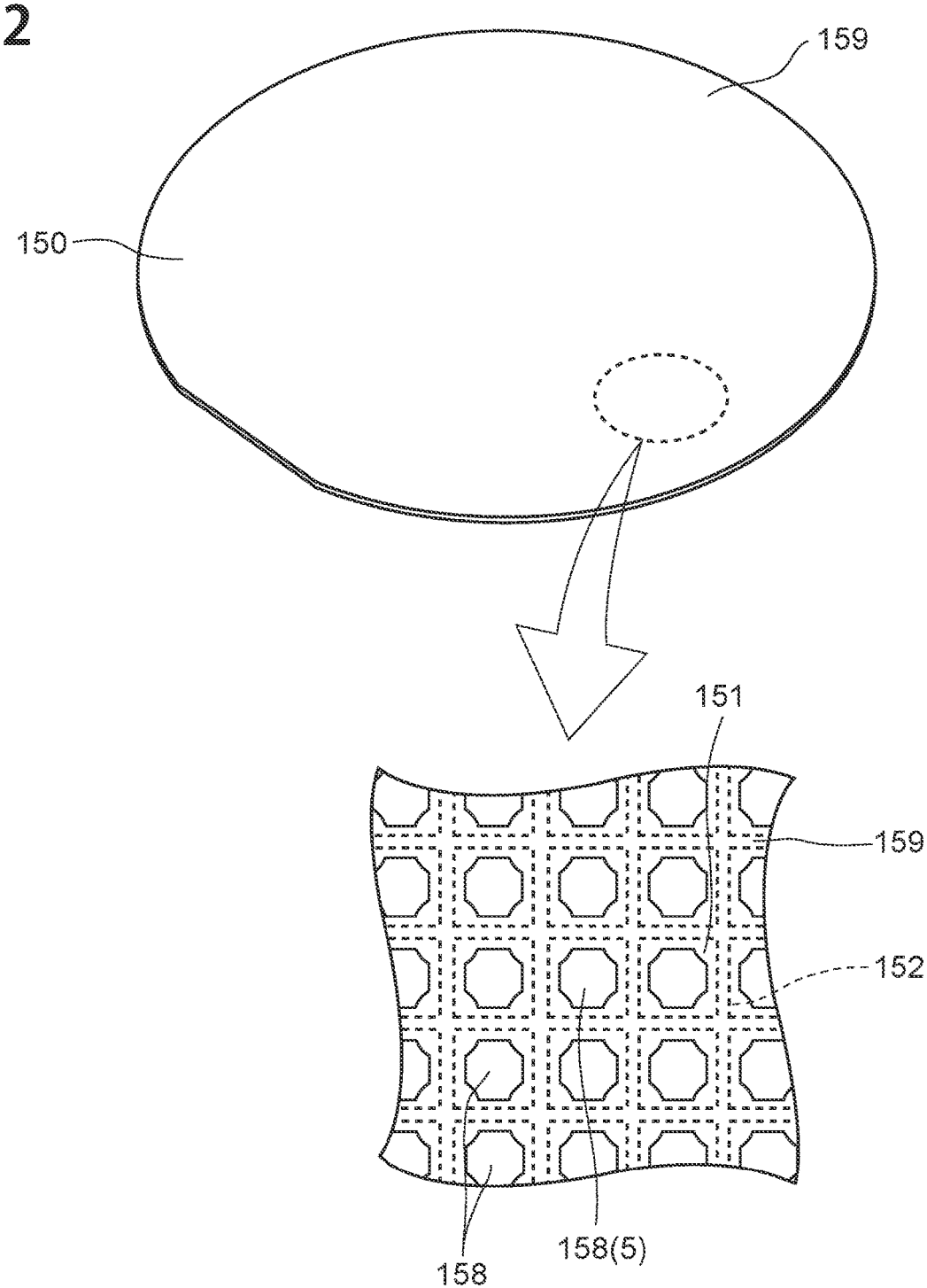
FIG. 22 is a perspective view showing the filter-wafer according to the second embodiment of the present invention.
Figure 23:
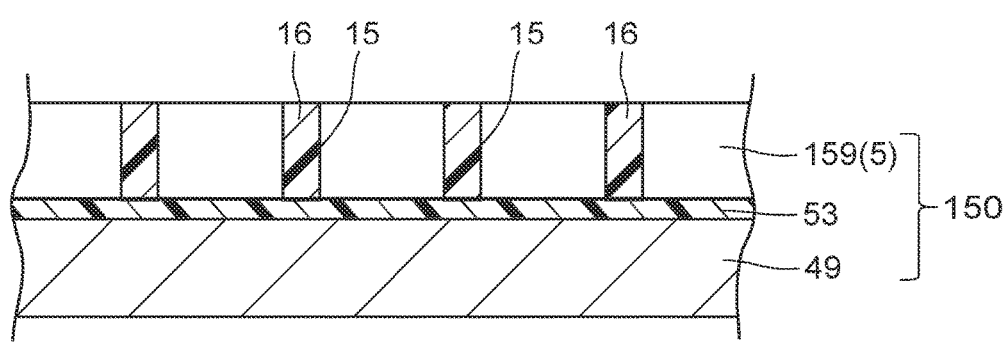
FIG. 23 is a sectional view showing a principal part of a filter-wafer manufacturing step according to the second embodiment of the present invention.
Figure 24:
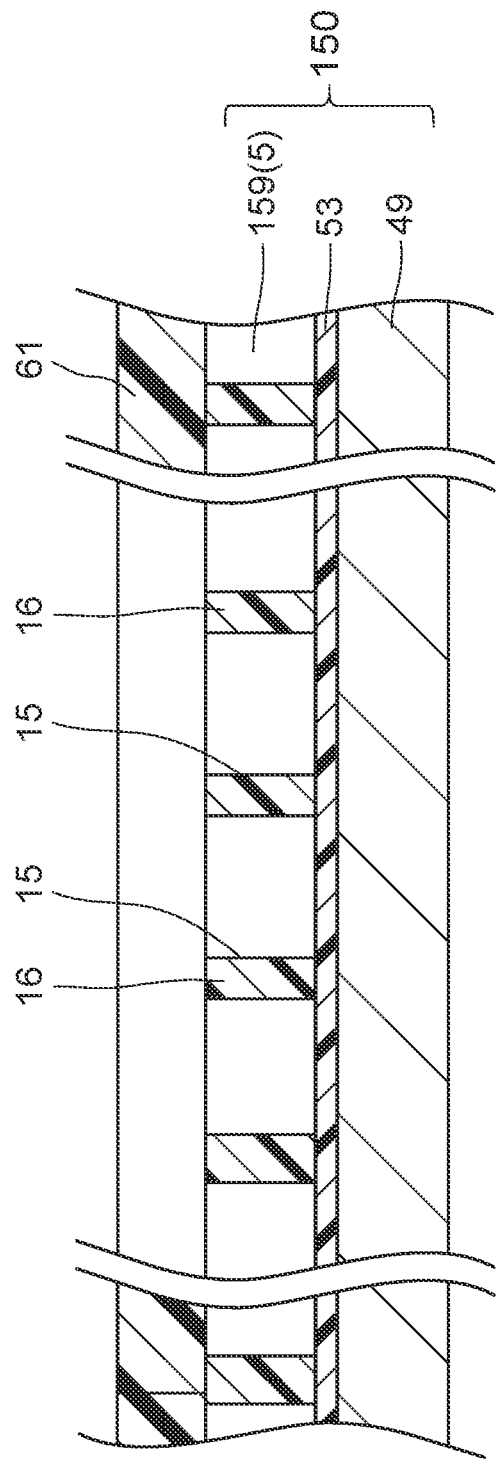
FIG. 24 is a sectional view showing a principal part of a photosensitive-adhesive layer forming step according to the second embodiment of the present invention.
Figure 25:
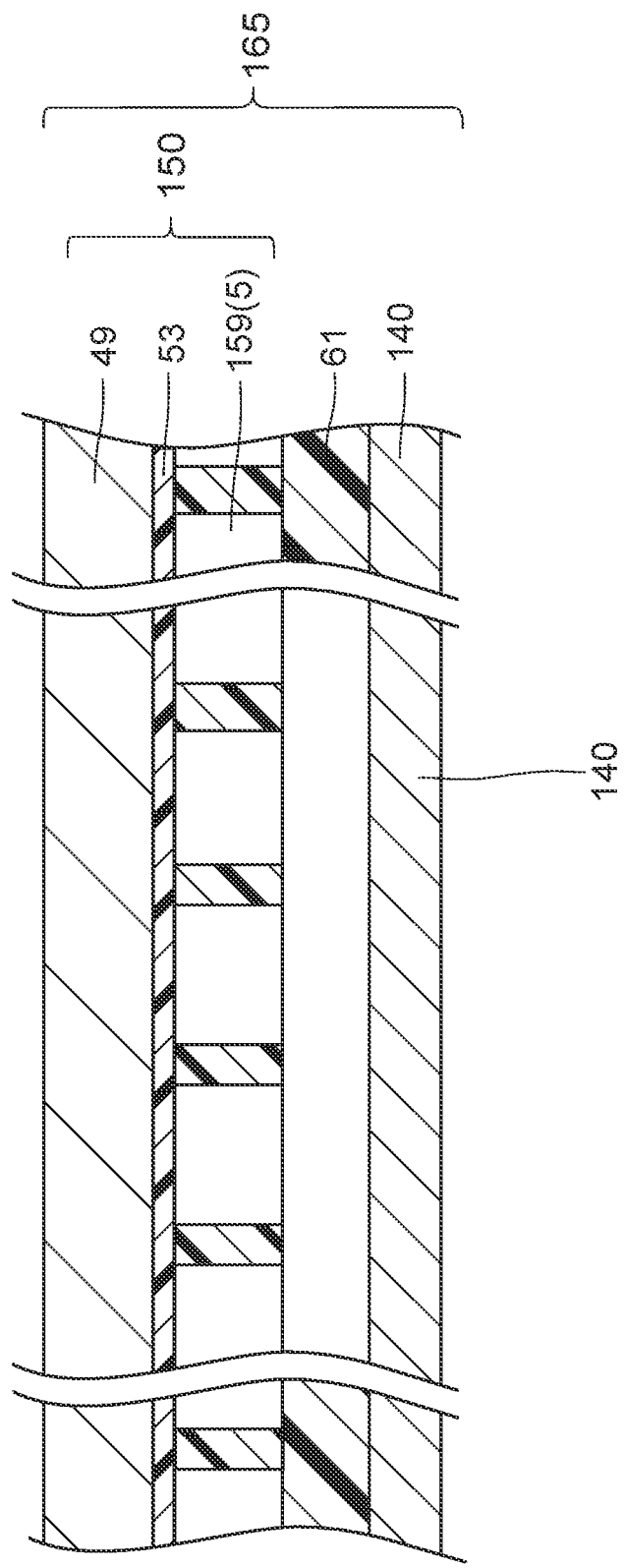
FIG. 25 is a sectional view showing a principal part of a substrate piling-up step according to the second embodiment of the present invention.
Figure 26:
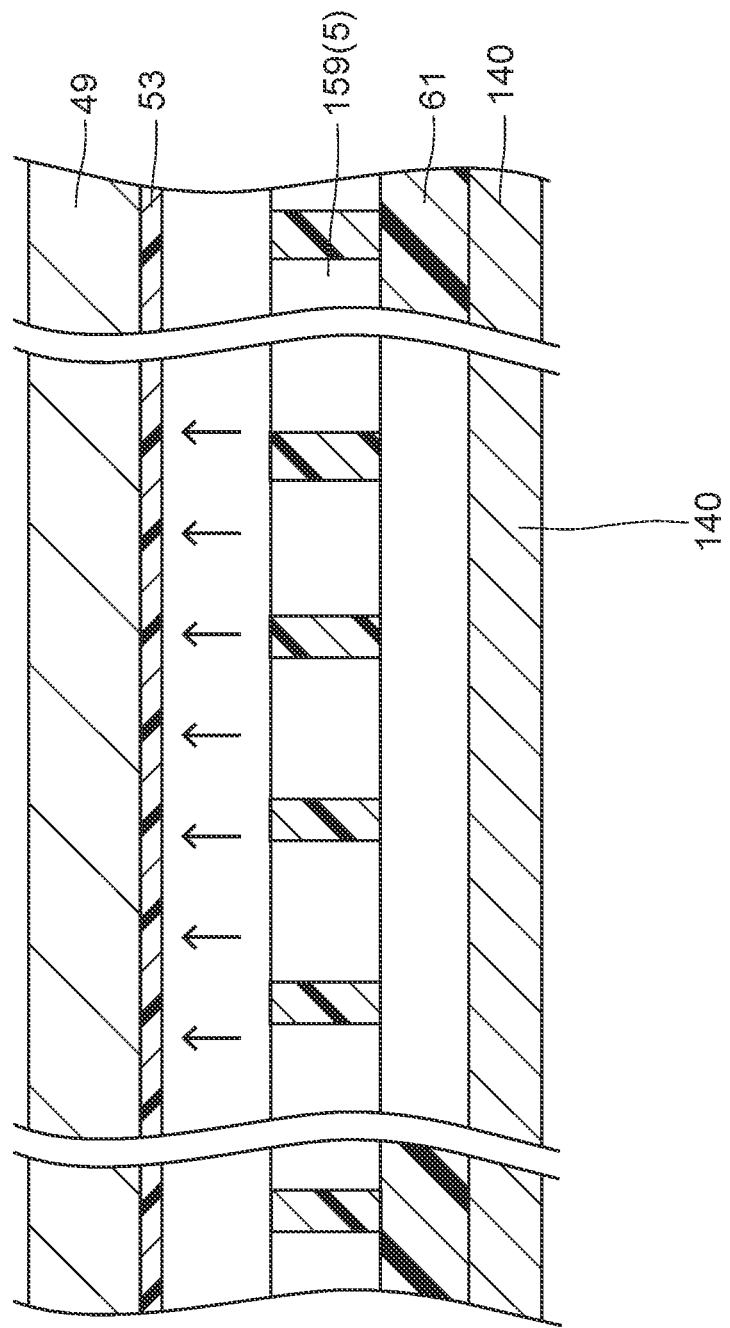
FIG. 26 is a sectional view showing a principal part of a filter-layer transcribing step according to the second embodiment of the present invention.
Figure 27:
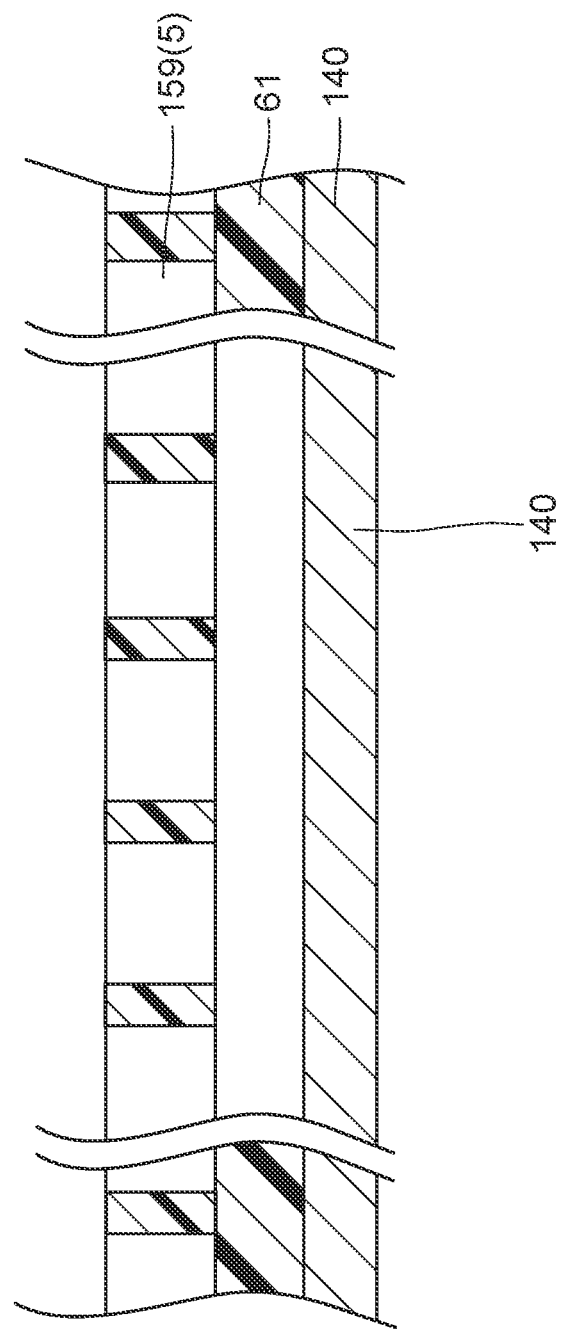
FIG. 27 is a sectional view showing a principal part of the manufacturing step subsequent to that in FIG. 26.

Subsequently, the method of manufacturing the MEMS package 101, having the above structure, will be explained with reference to FIG. 21 to FIG. 27. Here, FIG. 21 is a perspective view showing the later-described MEMS-wafer 140, FIG. 22 is a perspective view showing the later-described filter-wafer 150. FIG. 23 is a sectional view showing a principal part of the filter-wafer manufacturing step for manufacturing the filter-wafer 150, FIG. 24 is a sectional view showing a principal part of the photosensitive-adhesive layer forming step, FIG. 25 is a sectional view showing a principal part of a substrate piling-up step, FIGS. 26, 27 are sectional views showing principal parts of the filter-layer transcribing step.

In the Method of manufacturing the MEMS package 101, the MEMS-wafer 140, illustrated in FIG. 21, and the filter-wafer 150, as illustrated in FIG. 22, are used. Further, the filter-wafer manufacturing step, the photosensitive-adhesive layer forming step, the substrate piling-up step, the filter-layer transcribing step, a MEMS chip manufacturing step, a MEMS chip mounting step and a MEMS chip connecting step are included in the Method of manufacturing the MEMS package 101.

The filter-wafer 140 is formed with a semiconductor wafer made of silicon. Plural MEMS regions 141 are formed on the MEMS-wafer 140 by a regular arrangement. When the MEMS-wafer 140 is divided along with scribe lines 142, the MEMS chip 10 is formed from each MEMS region 141 (about 10,000-20,000 MEMS chip 10 are formed by every wafer).

The filter-wafer 150 is different in that the filter-layer 159 is formed, as compared with the filter-wafer 50. The filter-wafer manufacturing step is performed to manufacture the filter-wafer 150, similar with the filter-wafer 50. The thermal-removal layer forming step and the filter-layer forming step are included in the filter-wafer manufacturing step. In the thermal-removal layer forming step, as illustrated in FIG. 23, the thermal-removal layer 53 is formed on the surface of the semiconductor wafer 49. Further, the filter-layer 159 is formed on the thermal-removal layer 53, in the filter-layer forming step.

Then, plural filter-regions 151 are formed by the regular arrangement in accordance with the MEMS regions 141, in the filter-layer 159, as illustrated in FIG. 22. Dividing lines 152, in accordance with the scribe lines 142, are arranged between the respective filter-regions 151. One filter-part 158 is arranged in the respective filter region 151. Each filter region 151 does not have space for arranging two or more of filter-parts 158. There is no waste for securing the filter-part 158 concerning the filter-layer 159.

Then, each filter-part 158 becomes the above-described particle filter 5 later, similar with the filter-part 58. Plural through holes 15, common with the particle filter 5, are formed in the each filter-part 158. The filter-part 158 is formed in the modified rectangular shape in accordance with the particle filter 5.

On the other hand, in the photosensitive-adhesive layer forming step, as illustrated in FIG. 24, the photosensitive-adhesive layer 61 is formed on the surface of the filter-wafer 150. The photosensitive-adhesive layer 61 is formed by applying photosensitive polyimide adhesive sheet and so on. In this case, the photosensitive-adhesive layer 61 is formed on the surface of the filter-wafer 150 in a following hole-formed structure. In case of the hole-formed structure, the photosensitive-adhesive layer 61 is formed in that a circular part, corresponding to the peripheral part of the hole part 2c of the MEMS chip 10 formed from the each MEMS region 141, is remains and inside of the circular part is removed. The photosensitive-adhesive layer 61 is patterned by the exposure, development.

Further, in the substrate piling-up step, as illustrated in FIG. 25, the piled-up substrate 165 is manufactured. In this case, after a alignment, between each MEMS region 141 and each filter region 151, is performed, the MEMS-wafer 140 and the filter-wafer 150 are piling-up so that the MEMS-wafer 140 and the photosensitive-adhesive layer 61 of the filter-wafer 150 are piling-up, thereby the piled-up substrate 165 is manufactured.

In the next filter-layer transcribing step, at first, the piled-up substrate 165 is heated. Then, the thermal-removal layer 53 is foamed by that heat. Therefore, as illustrated in FIG. 26, the thermal-removal layer 53 and the semiconductor wafer 49 are removed from the piled-up substrate 165. Therefore, as illustrated in FIG. 27, the filter-layer 159 remains on the photosensitive-adhesive layer 61. Thereby, the filter-layer 159 is transcribed on the MEMS-wafer 140.

After that, the hydrophobicity-applying step is performed. In the hydrophobicity-applying step, the MEMS-wafer 140, which the filter-layer 159 is transcribed, was put in the hydrophobic-vessel to perform hydrophobic process with hydrophobic-gas. Then, hydrophobicity is applied to the MEMS-wafer 140. Accordingly, hydrophobicity is applied to not only the particle filter 5 but also the membrane 3 and back-plates. Therefore, hydrophobicity-applying is performed effectively. Further, because hydrophobicity-applying is performed with hydrophobic-gas, the membrane 3 and back-plates are never damaged.

Further subsequently, the MEMS chip manufacturing step is performed. In the MEMS chip manufacturing step, the MEMS-wafer 140 is cut along with the scribe lines 142. Then, the MEMS-wafer 140 is divided into the plural MEMS-regions 141. The MEMS chip 10 is manufactured from the respective MEMS regions 41. The above-described particle filter 5 is formed in the manufactured MEMS chip 10.

After that, the MEMS chip mounting step is performed. In the MEMS chip mounting step, the MEMS chip 10, manufactured by the MEMS chip manufacturing step, is mounted on the package substrate 20. Further, the MEMS chip connecting step is performed. In the MEMS chip connecting step, the MEMS chip 10 is mounted on the package substrate 20 by the wire bonding with the wires 16, 17. In this way, the MEMS package 101 is manufactured.

Because, the MEMS package 101 has the particle filter 5, similar with the MEMS package 1, it exhibits operation and effect the same with the MEMS package 1.

Especially, in case of the MEMS package 101, because the filter region 151, for forming the particle filter 5, does not have the space for arranging two or more of filter-parts 158, there is no waste for securing the filter-part 158 concerning the filter-layer 159. Therefore, the many MEMS chips 10, which the particle filters 5 are formed (namely with particle filter), are able to be manufactured from one wafer. Accordingly, effects such as manufacturing cost-reduction and manufacturing-time shortening or the like are obtained.

ANOTHER MODIFIED EXAMPLE

Figure 29:
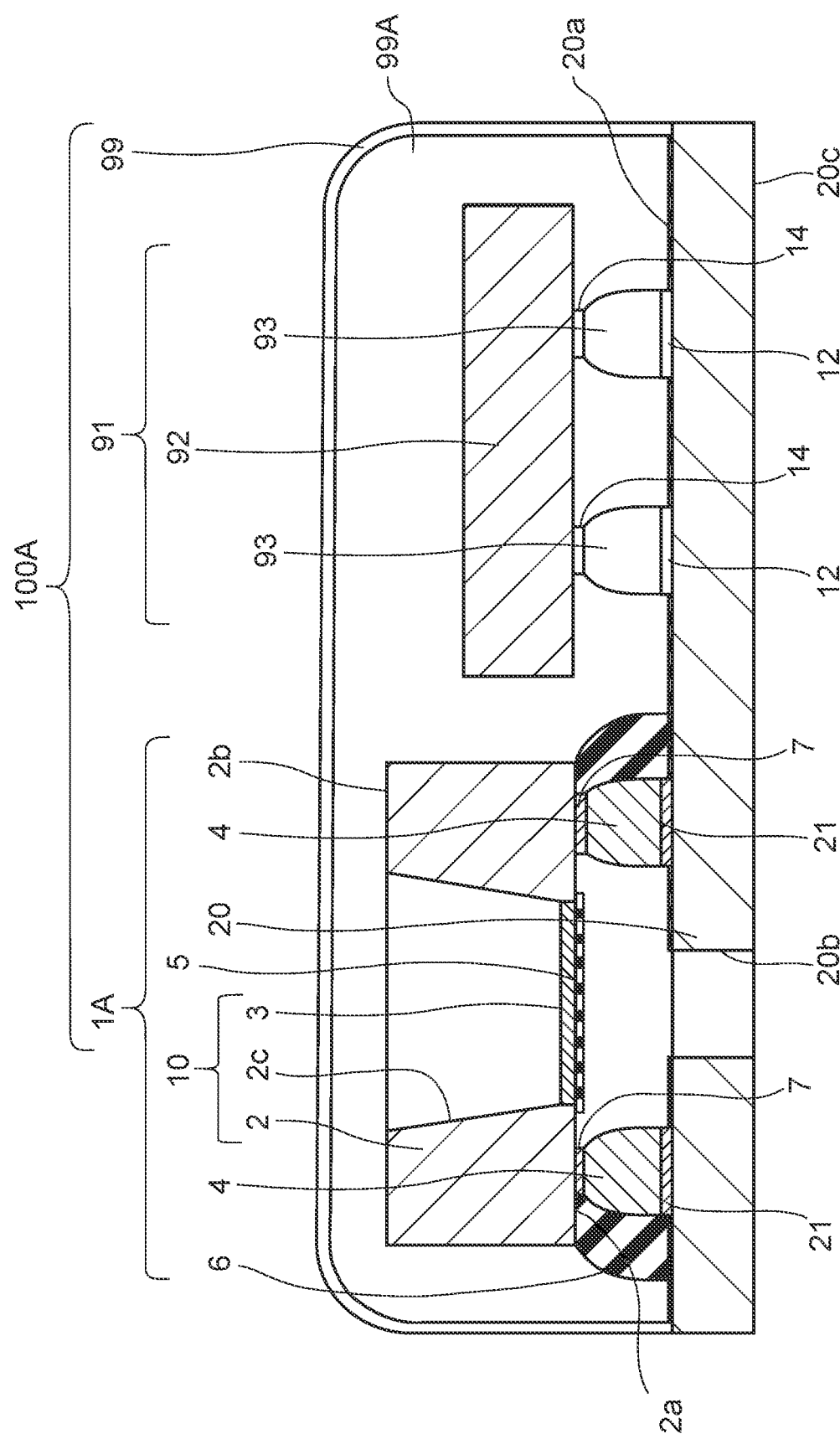
FIG. 29 is a sectional view corresponding to FIG. 1, showing the MEMS microphone having the MEMS package according to the modified example.
Figure 30:
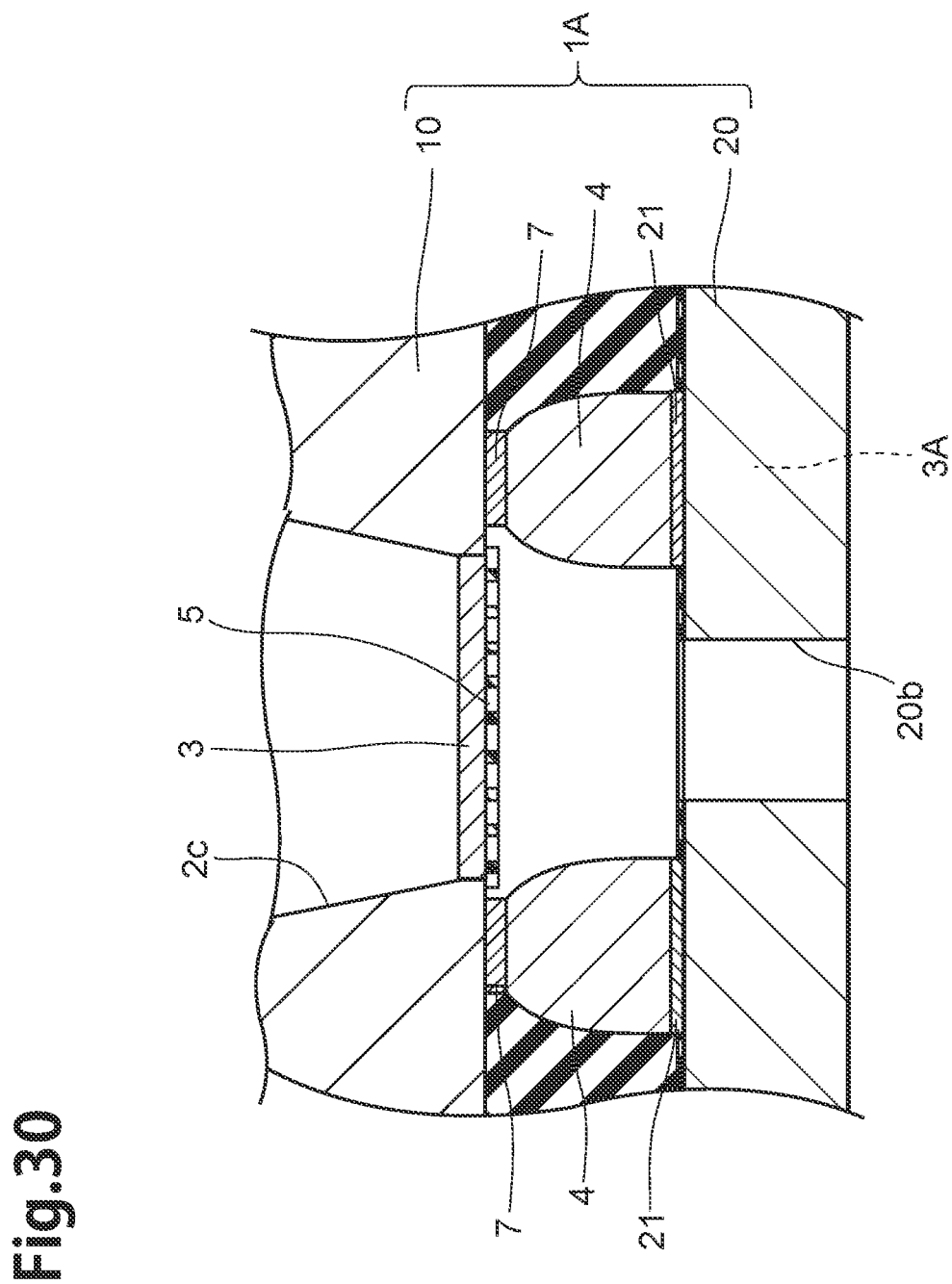
FIG. 30 is a sectional view corresponding to FIG. 2, showing the MEMS microphone illustrated in FIG. 29.

FIG. 29 is a sectional view corresponding to FIG. 1, showing a MEMS microphone 100A having the MEMS package 1A according to the modified example. FIG. 30 is a sectional view corresponding to FIG. 2, showing the MEMS microphone 100A.

The MEMS package 1A is different in that the particle filter 5 is formed on the MEMS chip 10, as compared with the MEMS package 1. Because the MEMS package 1A has the particle filter 5, similar with the MEMS package 1, it exhibits operation and effect the same with the MEMS package 1.

In case of the MEMS package 1A, the particle filter 5 is formed on the MEMS chip 10. Therefore, the MEMS chip 10 is manufactured by the manufacturing method similar with the MEMS package 101, according to the second embodiment, further, the MEMS chip 10 is mounted on the package substrate 20 by the FCB, thereby the MEMS package 1A is manufactured.

Figure 31:
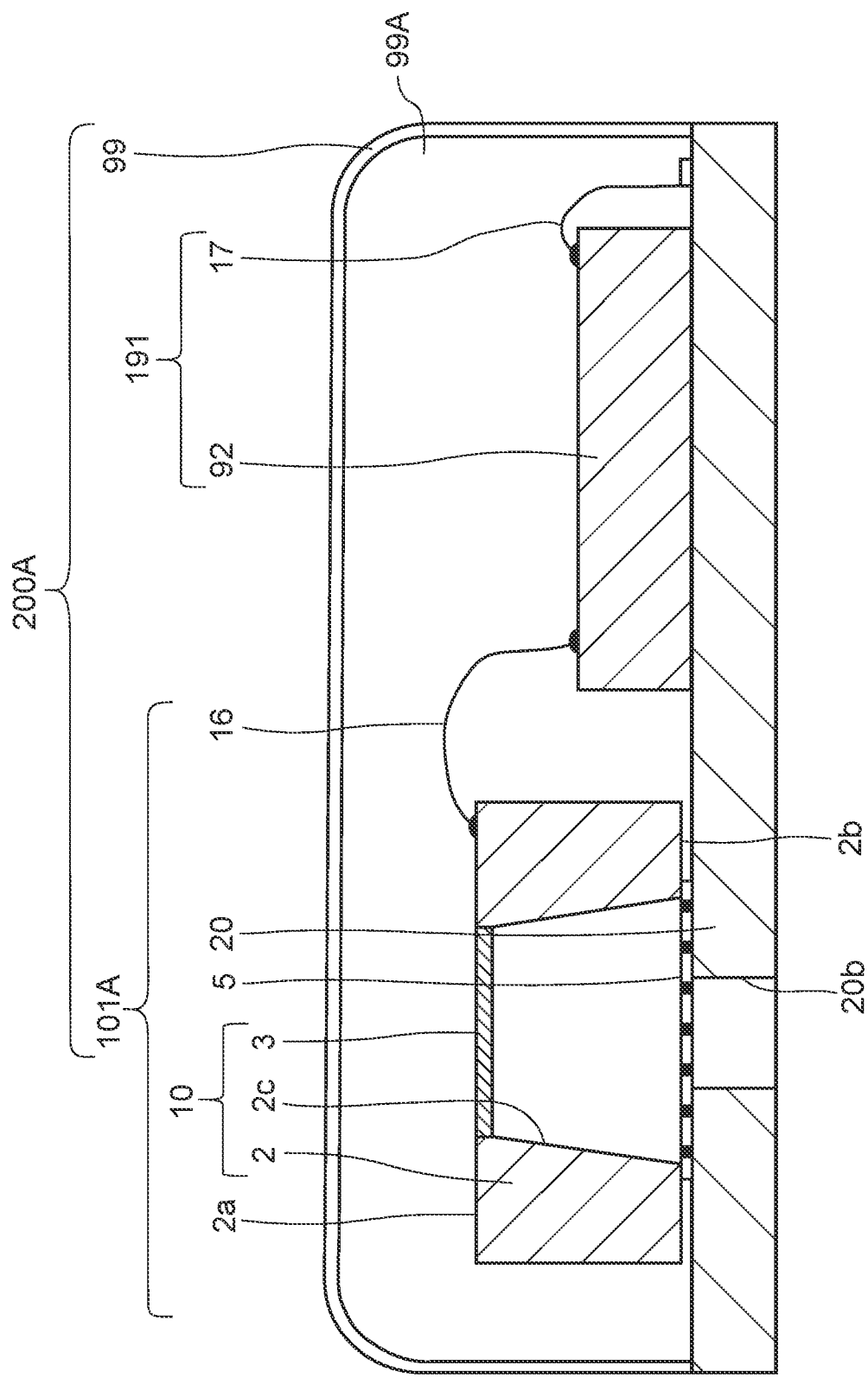
FIG. 31 is a sectional view corresponding to FIG. 20, showing the MEMS microphone having the MEMS package according to another modified example.

FIG. 31 is a sectional view corresponding to FIG. 20, showing the MEMS microphone 200A having the MEMS package 101A according to another modified example. The MEMS package 101A is different in that the particle filter 5 is formed on the package substrate 20, as compared with the MEMS package 101. Because the MEMS package 101A has the particle filter 5, similar with the MEMS package 101, it exhibits operation and effect the same with the MEMS package 101.

In case of the MEMS package 101A, the particle filter 5 is formed on the package substrate 20. Therefore, the MEMS package 101A is manufactured by using the package-panel 40 similar with the first embodiment. In this case, the filter-layer 59 is transcribed on the package-panel 40, similar with the first embodiment (for example, see FIG. 17). Then, the MEMS chip 10 and so on are mounted on the package-panel 40 by the wire-bonding, after that, the hydrophobicity-applying step, the panel cutting step and so on are performed to manufacture the MEMS package 101A.

In the above-described embodiment, the MEMS package 1, having the membrane 3, is exemplarily explained though, the present invention is able to be applied to another MEMS packages. For example, the present invention is also applicable to the MEMS packages having the MEMS chip being used as a sensor, an actuator and so on. Further, the type "double back-plate" having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3. In this case, it is sufficient that the two bonding bumps 4 are formed. Further, the through hole 15, formed in a circular-shape in a plan view, is exemplarily explained though, as the through hole formed in the particle filter 5, the through holes, formed in a non-circular-shape such as rectangular, hexagon or the like, are able to be formed in the particle filter. In this case, as for the thickness-opening rate, it is able to be defined as the ratio of the size of the through hole to the thickness of the particle filter This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS package comprising:
   a MEMS chip, and a package substrate which the MEMS chip is adhered, the package substrate having a package surface on a side of the MEMS chip and a sound hole which penetrates the package substrate; and
   wherein the MEMS chip comprises an element substrate which a hole part is formed and a movable element is formed in the hole part,
   wherein the MEMS package comprises a particle filter formed on an outer flat surface of the MEMS chip,
   wherein the particle filter comprises a pierced-structure, which plural through holes are formed on a base surface of the particle filter by a regular arrangement,
   wherein in the particle filter, a plane-opening rate, defined as the ratio of an area of the plural through holes, being included in the base surface, to an area of the base surface, is set at least 45%, and a thickness-opening rate, defined as the ratio of a diameter of each through hole to a thickness, from the base surface to a rear surface, of the particle filter, is set at least 50%,
   wherein both the base surface and the rear surface of the particle filter do not contact the package surface of the package substrate;
   wherein the particle filter is formed on the outer flat surface of the MEMS chip so as to cover the hole part of the element substrate and directly oppose to the sound hole; and
   wherein the MEMS package further comprises a plurality of bonding bumps adhered to the outer flat surface of the MEMS chip and the package surface of the package substrate.

2. The MEMS package according to claim 1,
   wherein the plural through holes are formed in a circular-shape in a plan view,
   wherein the plane-opening rate is set by the ratio of the following X2 to the following X1,
   X1: a size of a polygon which at least three centers, of adjacent representative through holes in the plural through holes, are vertexes,
   X2: a size of parts, arranged in the polygon, of all the adjacent representative through holes.

3. The MEMS package according to claim 1,
   wherein the plural through holes are formed in a circular-shape in a plan view,
   wherein the particle filter has a first through hole-group and a second through hole-group, having respectively the plural through holes,
   wherein the first through hole-group has a first through hole, arranged in a position which the interval to a peripheral end part of the base surface is set a first interval, and the plural through holes are arranged at a constant interval in a straight line, wherein the second through hole-group has a second through hole, arranged in a position which the interval to the peripheral end part is set a second interval different from the first interval, and the plural through holes are arranged at a constant interval in a straight line, wherein in the particle filter, a first line, formed by the first through hole-group, and a second line, formed by the second through hole-group, are arranged alternately, wherein the through holes, included in the base surface, are arranged uniformly.

4. The MEMS package according to claim 3, wherein in the particle filter, adjacent plural through holes in the plural through holes, including both the through hole included in the first through hole-group and the through hole included in the second through hole-group, are arranged so as to form a regular triangle which the centers of the adjacent plural through holes are vertexes.

5. The MEMS package according to claim 3, wherein in the particle filter, adjacent plural through holes in the plural through holes, including both the through hole included in the first through hole-group and the through hole included in the second through hole-group, are arranged so as to form a regular triangle which the centers of the adjacent plural through holes are vertexes, and an area of the adjacent plural through holes, forming the regular triangle, is greater than or equal to 90% of an area of the regular triangle.

6. The MEMS package according to claim 1, wherein the plural through holes are formed in a circular-shape in a plan view, wherein the particle filter has a first through hole-group and a second through hole-group, having respectively the plural through holes, wherein the first through hole-group has a first through hole, arranged in a position which the interval to a peripheral end part of the base surface is set a first interval, and the plural through holes are arranged at a constant interval in a straight line, wherein the second through hole-group has a second through hole, arranged in a position which the interval to the peripheral end part is set a second interval different from the first interval, and the plural through holes are arranged at a constant interval in a straight line, wherein the particle filter is formed so that the center of the through hole, included in the second through hole-group, is arranged between the centers of the adjacent through holes, included in the first through hole-group, wherein the through holes, included in the base surface, are arranged uniformly.

7. The MEMS package according to claim 1, wherein the plural through holes are formed in a circular-shape in a plan view, wherein the particle filter has plural through hole-groups having respectively the plural through holes, wherein the through hole-groups have an end-through hole arranged in a position which the interval between a peripheral end part of the base surface and the end-through hole is set a constant end-interval, and the plural through holes are arranged at a constant interval in a straight line, wherein in the particle filter, adjacent four through holes in the plural through holes, included respectively in the adjacent two through hole-groups in the plural through hole groups, are arranged so as to form a square which the four centers of the adjacent four through holes are vertexes, and an area of the adjacent four through holes, forming the square, is greater than or equal to 45% of an area of the square, wherein the through holes, included in the base surface, are arranged uniformly.

8. A MEMS package comprising:
a MEMS chip, and a package substrate which the MEMS chip is adhered, the package substrate having a package surface on a side of the MEMS chip and a sound hole which penetrates the package substrate; and wherein the MEMS chip comprises an element substrate which a hole part is formed and a movable element is formed in the hole part, wherein the MEMS package comprises a particle filter formed on the package substrate, wherein the particle filter comprises a pierced-structure, which plural through holes are formed on a base surface of the particle filter by a regular arrangement, wherein in the particle filter, a plane-opening rate, defined as the ratio of an area of the plural through holes, being included in the base surface, to an area of the base surface, is set at least 45%, and a thickness-opening rate, defined as the ratio of a diameter of each through hole to a thickness, from the base surface to a rear surface, of the particle filter, is set at least 50%, wherein the MEMS package further comprising an adhesive layer being formed between a peripheral part of the particle filter and the package surface of the package substrate and directly contacting the peripheral part of the particle filter and the package surface of the package substrate, wherein a cross-sectional width of the particle filter is smaller than a cross-sectional width of an outer flat surface of the MEMS chip, wherein the particle filter is adhered to the package surface of the package substrate with the adhesive layer so as to cover the sound hole of the package substrate and directly oppose to the hole part of the element substrate.

9. The MEMS package according to claim 8, wherein the particle filter is formed with resin.

* * * * *